(12) United States Patent
Ohmi et al.

(10) Patent No.: US 8,592,810 B2
(45) Date of Patent: Nov. 26, 2013

(54) THIN FILM, METHOD OF FORMING THE SAME, AND SEMICONDUCTOR LIGHT-EMITTING ELEMENT COMPRISING THE THIN FILM

(75) Inventors: Tadahiro Ohmi, Sendai (JP); Hirokazu Asahara, Kyoto (JP); Atsutoshi Inokuchi, Tokyo (JP)

(73) Assignees: National University Corporation Tohoku University, Miyagi (JP); Rohm Co., Ltd., Kyoto (JP)

( * ) Notice: Subject to any disclaimer, the term of this patent is extended or adjusted under 35 U.S.C. 154(b) by 0 days.

(21) Appl. No.: 13/500,931

(22) PCT Filed: Oct. 7, 2010

(86) PCT No.: PCT/JP2010/067637
§ 371 (c)(1),
(2), (4) Date: Apr. 9, 2012

(87) PCT Pub. No.: WO2011/043414
PCT Pub. Date: Apr. 14, 2011

(65) Prior Publication Data
US 2012/0205652 A1 Aug. 16, 2012

(30) Foreign Application Priority Data
Oct. 9, 2009 (JP) .................................. 2009-235346

(51) Int. Cl.
*H01L 21/365* (2006.01)

(52) U.S. Cl.
USPC ............... 257/43; 257/E33.019; 257/E21.463

(58) Field of Classification Search
USPC .............................. 257/43, E33.019, E21.463
See application file for complete search history.

(56) References Cited

U.S. PATENT DOCUMENTS

| | | | |
|---|---|---|---|
| 2003/0146433 A1* | 8/2003 | Cantwell et al. | 257/43 |
| 2005/0141240 A1 | 6/2005 | Hata et al. | |
| 2010/0139762 A1 | 6/2010 | Ohmi et al. | |
| 2011/0084274 A1* | 4/2011 | Park et al. | 257/43 |

FOREIGN PATENT DOCUMENTS

| | | |
|---|---|---|
| JP | 2005-109059 | 4/2005 |
| JP | 2005-200737 | 7/2005 |
| JP | 2007-129271 | 5/2007 |
| JP | 2009-078942 | 4/2009 |
| WO | 2008/146575 | 12/2008 |

* cited by examiner

*Primary Examiner* — Long Pham
(74) *Attorney, Agent, or Firm* — Morgan, Lewis & Bockius LLP

(57) ABSTRACT

It is an object of the present invention to stably form an N-doped ZnO-based compound thin film. In the present invention, a gas containing oxygen and nitrogen and a nitrogen gas together with an organometallic material gas are supplied into a low-electron-temperature high-density plasma which is excited by microwave, thereby forming the N-doped ZnO-based compound thin film on a substrate as a film forming object.

13 Claims, 24 Drawing Sheets

(a)

(b) (c)

(a)

(b)

(c)

(d)

(a)

(b)

(c)

(a)

(b)

(a)

(b)

(a)

(b)

(c)

(a)

(b)

THIN FILM, METHOD OF FORMING THE SAME, AND SEMICONDUCTOR LIGHT-EMITTING ELEMENT COMPRISING THE THIN FILM This is a U.S. National Phase Entry of PCT Application No. PCT/JP2010/067637, filed Oct. 7, 2010, and claims the benefit of Japanese Patent Application Number 2009-235346, filed Oct. 9, 2009.

TECHNICAL FIELD

The present invention relates to a method of manufacturing an N-doped ZnO-based thin film and to a thin film formed using the method. Further, the present invention relates to electronic devices including a light-emitting element, a solar cell, a TFT, other general semiconductor devices, a flat-panel display device, and so on each having the thin film.

BACKGROUND ART

Conventionally, a compound-type semiconductor thin film is formed on a substrate for manufacturing a semiconductor light-emitting element. In terms of the need for reduction in light emission wavelength of the semiconductor light-emitting element, there has been a demand for forming such a thin film with high crystallinity and high quality from a material with a large bandgap energy. Further, in a display system, a display device, a solar cell, and a semiconductor light-emitting element, a transparent conductive thin film is used. There has been a demand for forming such a thin film at a low temperature in terms of a problem of heat resistance of a substrate.

On the other hand, such a transparent conductive thin film often contains indium as a constituent element. However, there is a possibility of depletion of indium as resources and thus there has been a demand for a thin film containing no indium.

It has been proposed to use a zinc oxide (ZnO)-based material as a thin film containing no indium. Patent Document 1 discloses a plasma-excited MOCVD (Metal Organic Chemical Vapor Deposition) apparatus as a manufacturing device of a ZnO-based thin film.

PRIOR ART DOCUMENT

Patent Document

Patent Document 1: International Publication No. WO2008/146575

SUMMARY OF THE INVENTION

Problem to be Solved by the Invention

To obtain an n-type ZnO film by doping a ZnO-based thin film with Ga has been achieved by the technique disclosed in Patent Document 1. However, it has been found out that doping with N in order to obtain a p-type ZnO film is not easy. Specifically, Patent Document 1 discloses that, when N is used as a dopant in order to form the p-type ZnO film, $N_2$ or NO is caused to flow together with an organometallic material gas containing Zn, a plasma excitation gas (any one of Ar, Kr, Xe and He), and a reaction gas ($O_2$). However, it has been found out that, even if the film is formed in accordance with the above-described disclosure, the film can not contain N.

It is therefore an object of the present invention to provide an effective method of doping a ZnO-based thin film with N.

Means to Solve the Problem

According to one aspect of the present invention, there is provided a thin film forming method characterized by comprising supplying a gas including a nitrogen dioxide ($NO_2$) gas, a nitrogen ($N_2$) gas, and an organometallic material gas containing at least Zn into a plasma generated using a microwave-excited high-density plasma generator, thereby forming, on a film forming object, at least a nitrogen (N)-doped ZnO-based compound thin film.

Herein, the gases according to the present invention include a plasma excitation gas, a material gas, and a doping reactive gas. Among them, the plasma excitation gas contains a noble gas, such as Ar, Kr, Xe, or He. The material gas contains an organometallic material gas containing Zn. Further, in order to use N as a dopant, as an oxygen material gas and the doping reactive gas, a gas containing oxygen and nitrogen, such as $NO_2$ and $N_2$, are simultaneously caused to flow. It is noted here that the reactive gas and/or the material gas may be used as the plasma excitation gas.

According to another aspect of the present invention, there is provided the thin film forming method as claimed in the above-described aspect, characterized by comprising further supplying an organometallic material gas containing Mg, thereby forming, on the film forming object, a thin film of a nitrogen (N)-doped and Mg-added ZnO-based compound.

According to still another aspect of the present invention, there is provided the thin film forming method according to any one of the above-described aspects, characterized by comprising annealing the thin film after formation of the thin film. As an annealing condition, the annealing is performed at a temperature of 400° C. or higher in an atmosphere containing no hydrogen.

According to another aspect of the present invention, there is provided the thin film forming method in any one of the above-described aspects, characterized by comprising applying, during formation of the thin film, a bias potential to the film forming object to irradiate a surface of the film with ions in the plasma.

According to still another aspect of the present invention, there is provided the thin film forming method in the above-described aspect, characterized by comprising setting the bias potential to be applied to a potential such that a photoluminescence property of the formed thin film is improved as compared with a case of applying no bias potential.

According to yet another aspect of the present invention, there is provided The thin film forming method in the above-described aspect, characterized by comprising setting the bias potential to be applied to a potential such that, in the formed thin film, a photoluminescence intensity of band-edge emission at a bandgap inherent to a material is increased and an intensity of emission at other levels is reduced as compared with a case of applying no bias potential.

According to another aspect of the present invention, there is provided the thin film forming method in the above-described aspect, characterized by comprising setting the bias potential to be applied to a potential such that a film structure of the formed thin film is improved in flatness as compared with a case of applying no bias potential.

According to still another aspect of the present invention, there is provided the thin film forming method according to any one of the above-described aspects, characterized by using an organometallic gas containing Zn as the organometallic material gas.

According to yet another aspect of the present invention, there is provided a thin film characterized in that the thin film is formed using the thin film forming method claimed in any one of the above-described aspects and contains mainly p-type ZnO.

The thin films in the above-described aspects may be transparent. The thin film may be formed on a glass substrate or a resin substrate.

According to another aspect of the present invention, there is provided a semiconductor light-emitting element characterized by having the thin film in any one of the above-described aspects.

According to still another aspect of the present invention, there is provided a thin film forming method characterized by comprising supplying a gas including a nitrogen dioxide ($NO_2$) gas and an organometallic gas containing at least Zn, or a gas including a nitrogen dioxide ($NO_2$) gas, a nitrogen ($N_2$) gas, and an organometallic material gas containing at least Zn, thereby forming, on a film forming object, at least a nitrogen (N)-doped ZnO-based compound thin film by thermal CVD.

Effect of the Invention

According to the present invention, by using a gas including a nitrogen dioxide ($NO_2$) gas, a nitrogen ($N_2$) gas, and an organometallic material gas containing at least Zn, it becomes possible to form a nitrogen (N)-doped ZnO-based compound thin film.

MODE FOR EMBODYING THE INVENTION

Figure 1:
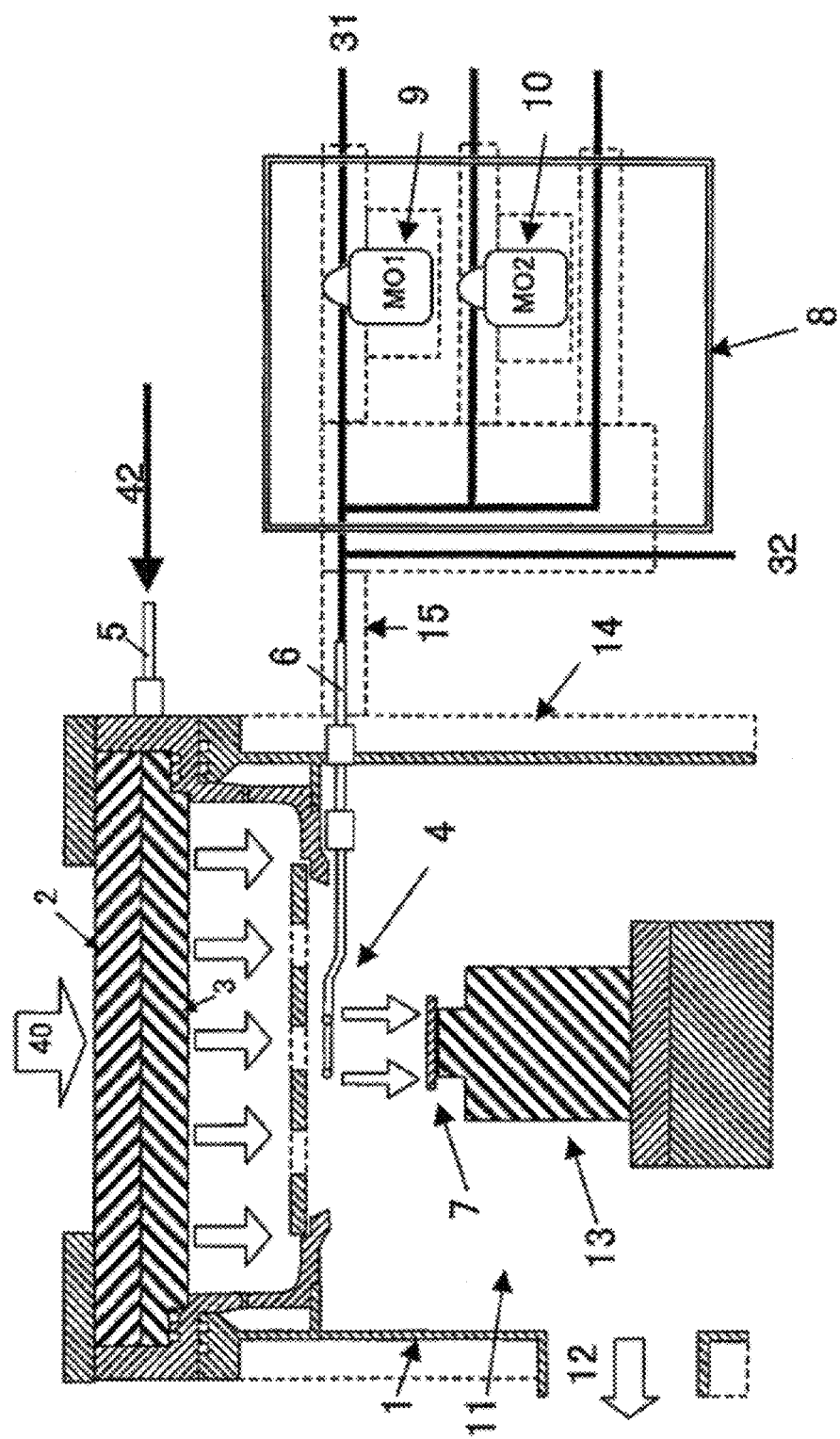
FIG. 1 is a schematic sectional view showing a plasma processing apparatus according to an embodiment of the present invention.

Hereinbelow, embodiments of the present invention will be described with reference to the drawing.

FIG. 1 is a schematic sectional view showing a plasma processing apparatus according to an embodiment of the present invention. The illustrated plasma processing apparatus 1 is a microwave-excited high-density plasma processing apparatus and has a process chamber 11 formed within a tubular body which is sealed at both upper and lower ends thereof, and an organometallic material supply system 8 formed within a housing separate from the process chamber 11.

The process chamber 11 is provided therein with an insulator plate 2 formed on one end side of the tubular body and an upper shower plate 3 formed inside the insulator plate 2. Further, below the upper shower plate 3, a lower shower nozzle 4, a stage 13, and a substrate 7 placed on the stage 13 so as to face the lower shower nozzle are arranged.

Herein, a microwave 40 (having a frequency of 2.45 GHz in this embodiment) is transmitted through the insulator plate 2 and the upper shower plate 3 and radiated into a plasma generation region in an upper part of the plasma processing apparatus 1. An Ar gas (alternatively, Kr gas, Xe gas, or He gas) as a plasma excitation gas is supplied to the upper shower plate 3 through an introduction pipe 5 provided at an upper lateral portion of the tubular body and uniformly ejected from the upper shower plate 3 into the plasma generation region. The microwave 40 is radiated into the plasma generation region as described above and a plasma is excited in the plasma excitation gas by the microwave 40. The plasma is introduced from the plasma generation region into a plasma diffusion region and to the lower shower nozzle 4 disposed in the plasma diffusion region.

Herein, an upper gas 42 containing the plasma excitation gas, such as Xe, Kr, He, or Ar, and a reactive gas, such as $O_2$, $N_2$, NO, or $NH_3$, are introduced into the upper shower plate 3 through the introduction pipe 5. On the other hand, an organometallic material gas is caused to flow into the lower shower nozzle 4 through an introduction pipe 6. As a consequence, a compound thin film can be formed on a surface of the substrate 7.

In the illustrated plasma processing apparatus 1, the organometallic material supply system 8 supplies an organometallic material. In the organometallic material supply system 8, one or a plurality of MO containers 9 and 10 are provided. From these MO containers 9 and 10, an organometallic material is sent to the lower shower nozzle 4 through the introduction pipe 6.

An exhaust gas in the process chamber 11 passes through an exhaust duct via an exhaust system 12 which is not shown in the figure and then is introduced into a small pump through any of inlet ports of the small pump.

The illustrated process chamber 11 has a size with a diameter of 240 mm and the stage 13 having a diameter of 33 mm is disposed in the chamber for placing the substrate 7 thereon. The illustrated stage 13 can be moved upward and downward by motor drive so that the substrate can be arranged at an optimal position. The stage 13 has a structure in which a heater is incorporated for heating the substrate 7 to control its temperature at a desired temperature.

A wall surface of the plasma processing apparatus 1 shown in FIG. 1 is temperature-controlled at, for example, 100° C. by a heater 14 for suppressing adhesion of reaction products. Further, a gas pipe extending from the organometallic material supply system 8 to an end portion of the nozzle is temperature-controlled by a heater 15 at a temperature not lower than that of each material container.

The insulator plate 2 disposed in the upper part of the process chamber 11 has a diameter of 251 mm and a thickness of 15 mm and the upper shower plate 3 has a diameter of 251 mm and a thickness of 30 mm. Materials of the insulator plate 2 and the upper shower plate 3 are both an alumina ceramic.

Figure 2:
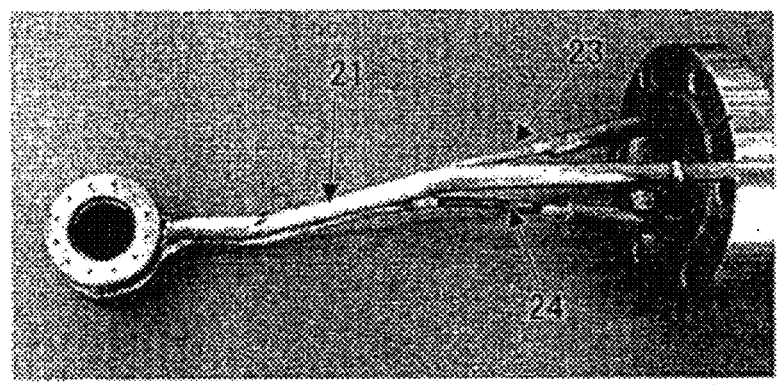
FIG. 2 shows, in (a), (b), (c), and (d), an example of a structure of a lower shower nozzle 4 in FIG. 1 and copying photographs showing "a bottom", "a perspective view of a bottom portion", "bottoms of nozzle end portions", and "the bottom provided with a cover", respectively.
Figure 2:
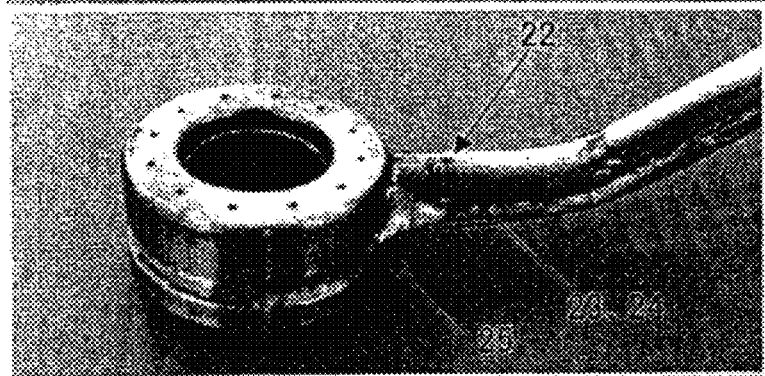
Figure 2:
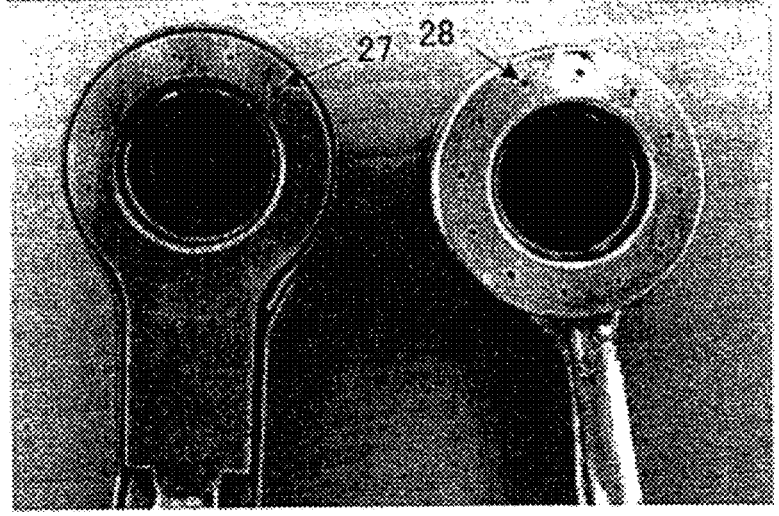
Figure 2:
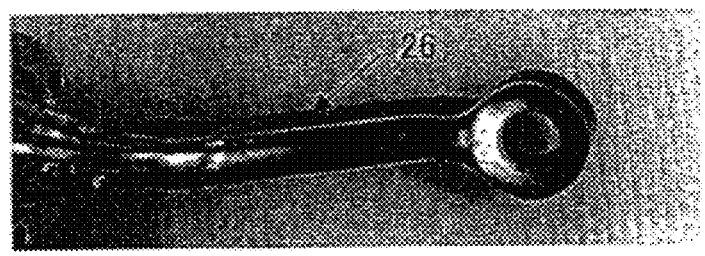

In FIG. 2, (*a*), (*b*), (*c*), and (*d*) are views showing an example of a structure of the lower shower nozzle 4 in FIG. 1 and copying photographs showing "a bottom", "a perspective view of a bottom portion", "bottoms of nozzle end portions", and "the bottom provided with a cover", respectively.

Referring to (*a*), (*b*), (*c*), and (*d*) in FIG. 2, the example of the lower shower nozzle 4 is shown. The illustrated lower shower nozzle 4 has a gas pipe 21 for sending a gas containing an organometallic material and a temperature control liquid pipe (for going) 23 and a temperature control liquid pipe (for return) 24 for controlling a nozzle temperature. Further, the lower shower nozzle is provided with a thermocouple 25 for measuring the nozzle temperature and a cover 26 covering the whole.

A lower surface of the nozzle end portion is provided with a plurality of small holes for uniformly ejecting a gas, for example, holes 27 having a diameter of 0.5 mm or holes 28 having a diameter of 0.7 mm. The nozzle end portion has a size with an outer diameter of 33 mm and an inner diameter of 17 mm.

Figure 3:
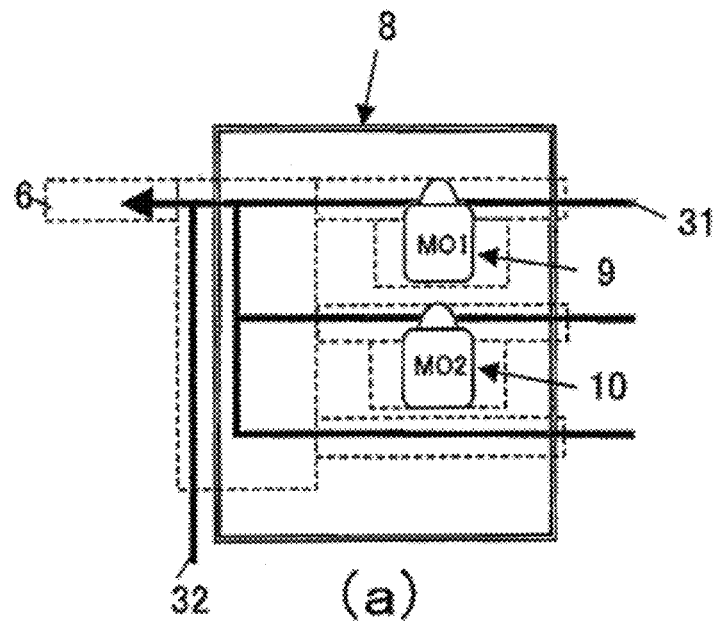
FIG. 3 shows, in (a), an organometallic material supply system 8 in FIG. 1 and, in (b), details of a container portion including an MO container 9.
Figure 3:
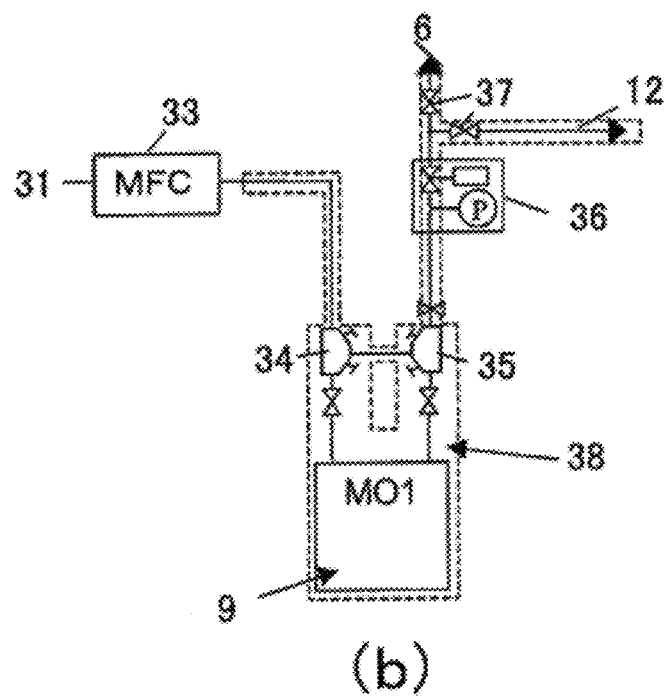

FIG. 3 (*a*) is a view showing the organometallic material supply system 8 in FIG. 1 and FIG. 3 (*b*) is a view showing details of a container portion including the MO container 9.

In FIG. 3 (*a*) of these views, an Ar gas (alternatively, Kr gas, Xe gas, or He gas) is used as a carrier gas 31 which passes through the MO containers 9 and 10, containing an organometallic material, to reach the introduction pipe 6, and as a push gas 32 for uniformly ejecting a gas from the nozzle.

On the other hand, referring to FIG. 3 (*b*), the carrier gas 31 is adjusted to a desired flow rate by a flow rate controller (Mass Flow Controller, MFC) 33 and then passes through the MO (Metal Organic) container 9 to reach the introduction pipe 6. The MO container 9 is controlled at a desired pressure and temperature by a pressure regulator 36 and a temperature control system 38. Valves 34, 35, and 37 are provided and a gas flow path can be switched by these valves 34, 35, and 37.

Next, plasma properties of the plasma processing apparatus according to the embodiment of the present invention will be described along with its measurement method.

Figure 4:
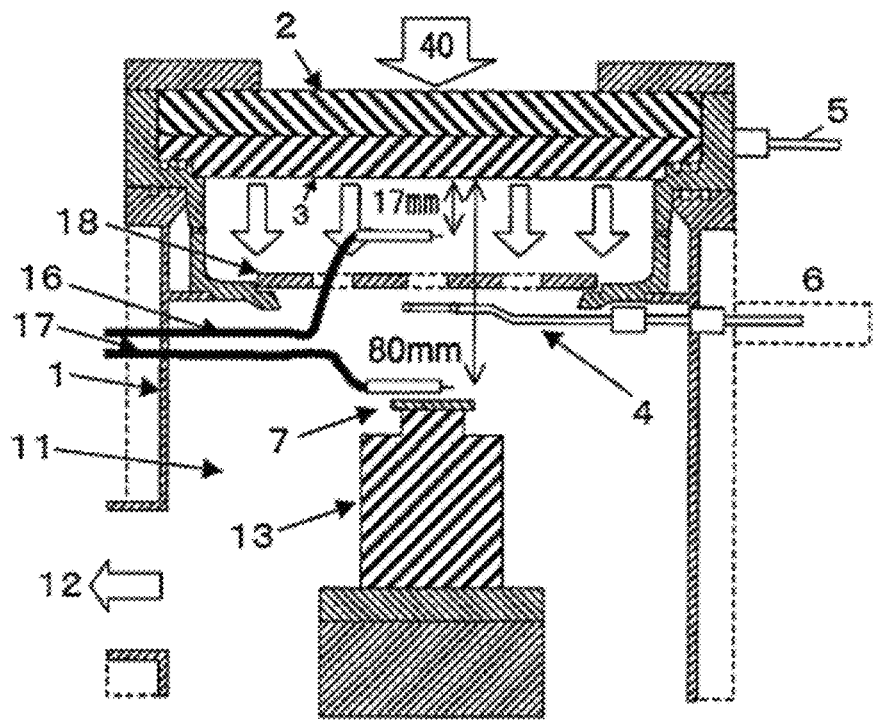
FIG. 4 shows a measurement method of plasma properties of the plasma processing apparatus according to the embodiment of the present invention and measurement results thereof, (a) showing the measurement method, (b) and (c) showing the measurement results.
Figure 4:
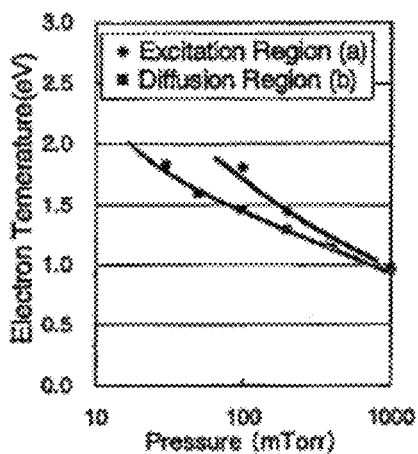
Figure 4:
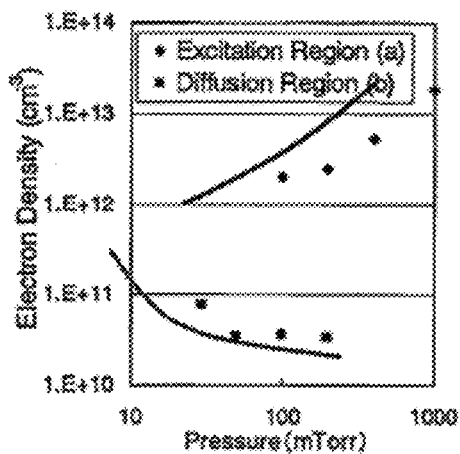

FIG. 4 shows the measurement method of the plasma properties of the plasma processing apparatus according to the embodiment of the present invention and measurement results thereof. (*a*) shows the measurement method and (*b*) and (*c*) show the measurement results.

First, as shown in FIG. 4 (*a*), the measurement method is performed by inserting probes 16 and 17 into a plasma excitation region and the plasma diffusion region, respectively. The results are shown in FIG. 4 (*b*) and FIG. 4 (*c*). A test condition is as follows and (*a*) and (*b*) in the figures show the plasma excitation region and the plasma diffusion region, respectively.

Ar gas flow rate: 200 sccm
Microwave supply power: 600W
Distance between the probe 16 and a dielectric plate (upper shower plate 3): 17 mm
Distance between the probe 17 and the dielectric plate (upper shower plate 3): 80 mm As a result of this measurement, it is found that an electron temperature is a low electron temperature of 1 eV to 2 eV as shown in FIG. 4 (*b*) and an electron density is a high density plasma of E12 or more in the excitation region as shown in FIG. 4 (*c*). A density over the substrate 7 can be controlled by an opening ratio of a partition plate 18.

Next, a film forming process of a ZnO-based compound thin film according to the embodiment of the present invention will be described in detail.

Figure 5:
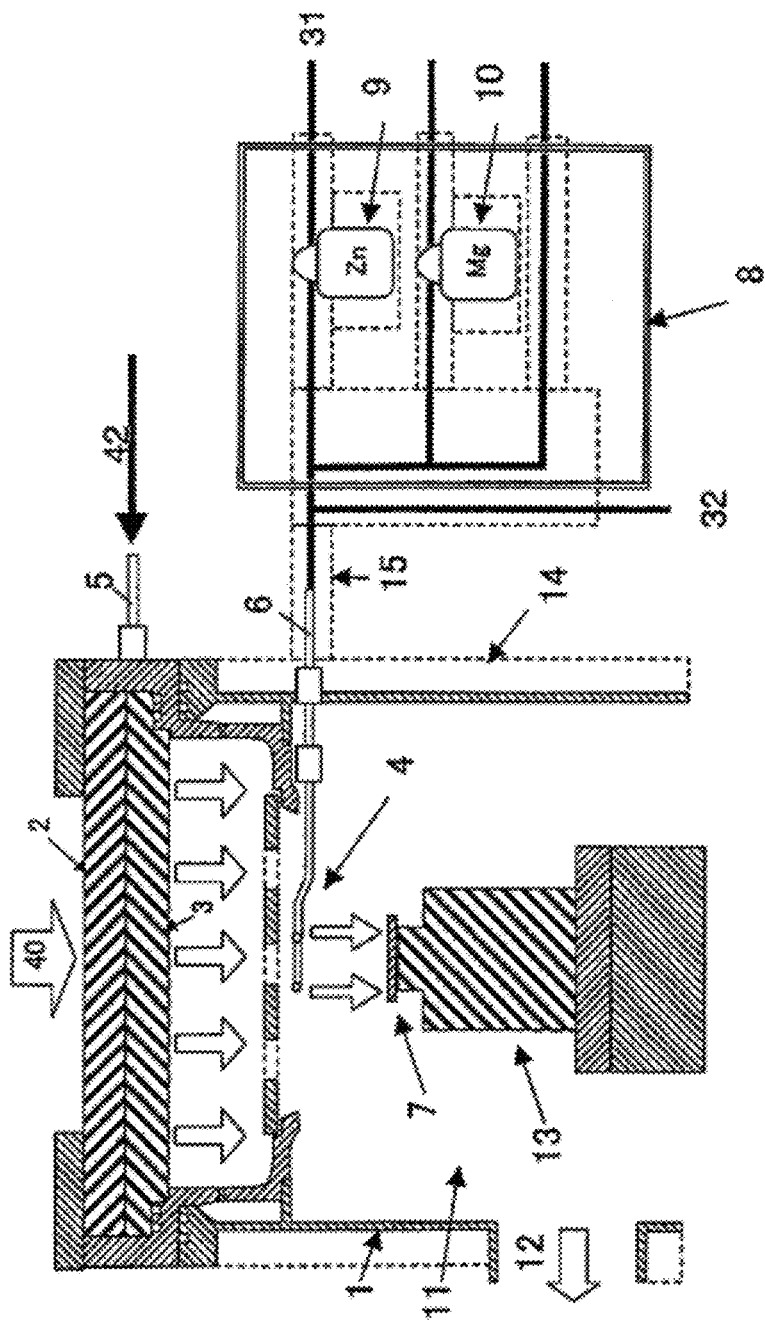
FIG. 5 is a view for use in describing a film forming process of a ZnO-based compound thin film according to the embodiment of the present invention.

FIG. 5 is a view for use in describing the film forming process of the ZnO-based compound thin film according to the embodiment of the present invention.

Referring to FIG. 5, in a nitrogen-doped ZnO film forming process according to the embodiment of the present invention, a ZnO film is formed using, as a lower gas, an organometallic material gas containing Zn and, as an upper gas, an Ar plasma added with a gas containing oxygen and nitrogen ($NO_2$ or $NO_2+N_2$). Instead of the Ar plasma, Kr, Xe, or He may be used.

Herein, as an organometallic material of Zn, DMZn or DEZn was used as shown in the following Table 1.

TABLE 1

| Organometallic Material of Zn | | |
|---|---|---|
| Notation | DMZn: $Zn(CH_3)_2$ | DEZn: $Zn(C_2H_5)_2$ |
| Structure | $H_3C\!-\!Zn\!-\!CH_3$ | $CH_3\!-\!CH_2\!-\!Zn\!-\!CH_2\!-\!CH_3$ |
| Molecular Formula | $C_2H_6Zn$ | $C_4H_{10}Zn$ |
| Molecular Weight | 95.4 | 123.51 |
| Melting Point | −29° C. | −30° C. |
| Density | 1.39 g/ml @ 10.5° C. | 1.21 g/ml @ 20° C. |
| Appearance | Colorless Liquid | Colorless Liquid |

Figure 6:
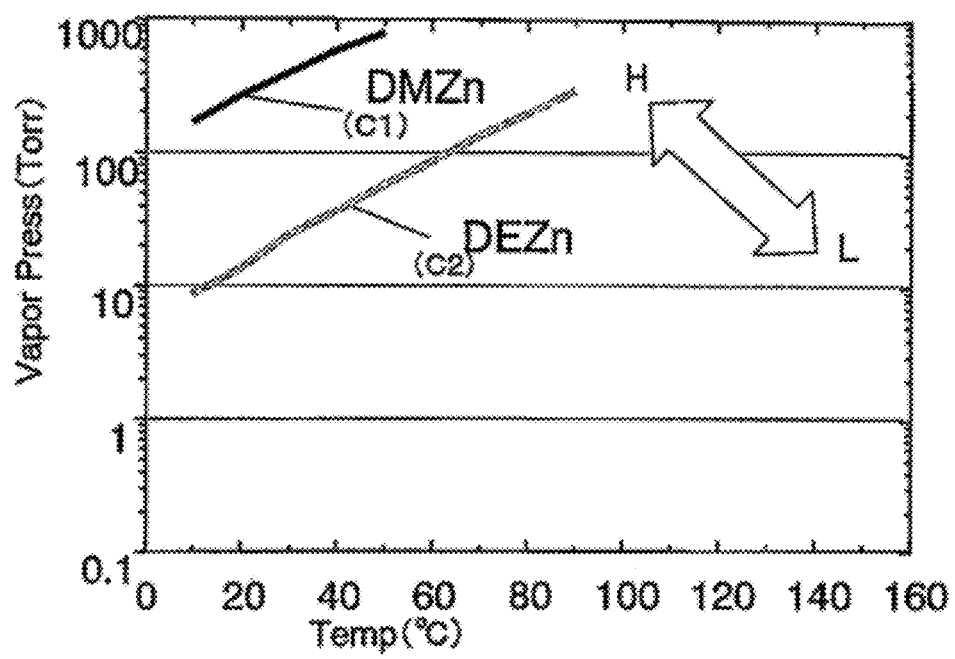
FIG. 6 shows respective vapor pressure properties of organometallic materials (DMZn and DEZn), "H" and "L" in the graph meaning a high vapor pressure and a low vapor pressure, respectively.

FIG. 6 is a graph showing respective vapor pressure properties of the organometallic materials (DMZn and DEZn). In FIG. 6, the vapor pressure properties of the materials (DMZn and DEZn) are shown by curves c1 and c2, respectively. As shown in FIG. 6, organometallic material gases of Zn change in vapor pressure depending on a temperature. Therefore, for controlling a material supply amount into the process chamber 11, it is necessary to control the temperature of the organometallic material supply system 8 and the temperature of the lower shower nozzle 4. Further, it is also necessary to take into account that the organometallic material gases are decomposed by heat.

In this embodiment, in film formation, the temperatures of the supply system and the gas pipe are adjusted depending on the organometallic material gas. Specifically, depending on the vapor pressure-temperature characteristic of each organometallic material gas, temperature control is implemented so that a positive temperature gradient is formed from the container 9, containing the material, to the lower shower nozzle 4. In this case, the temperature from the containers 9 and 10 to the lower shower nozzle 4 is controlled to be not higher than a decomposition temperature of the organometallic material gas of Zn. Further, for preventing the temperature rise due to plasma irradiation, the lower shower nozzle 4 is provided with the cooling medium flow paths (23 and 24 in FIG. 2 and, although not shown, inside a ring) and the thermocouple (25 in FIG. 2).

When an Ar gas, a Xe gas, a Kr gas, or a He gas and a gas containing oxygen and nitrogen ($NO_2$ or $NO_2+N_2$) are caused to flow into the upper shower plate 3 through the introduction pipe 5, and an organometallic material gas containing Zn is caused to flow into the lower shower nozzle 4 from the introduction pipe 6, an N-doped ZnO film can be formed on the substrate 7, for example, a ZnO substrate surface or a wafer surface.

Herein, referring to FIG. 5 again, an organometallic material of Mg is added to the organometallic material supply system 8 as shown in the figure and an organometallic material gas containing Mg is caused to flow from the introduction pipe 6 into the lower shower nozzle 4 together with the organometallic material gas containing Zn. As a consequence, a ZnO film containing Mg and doped with N can be formed.

Figure 7:
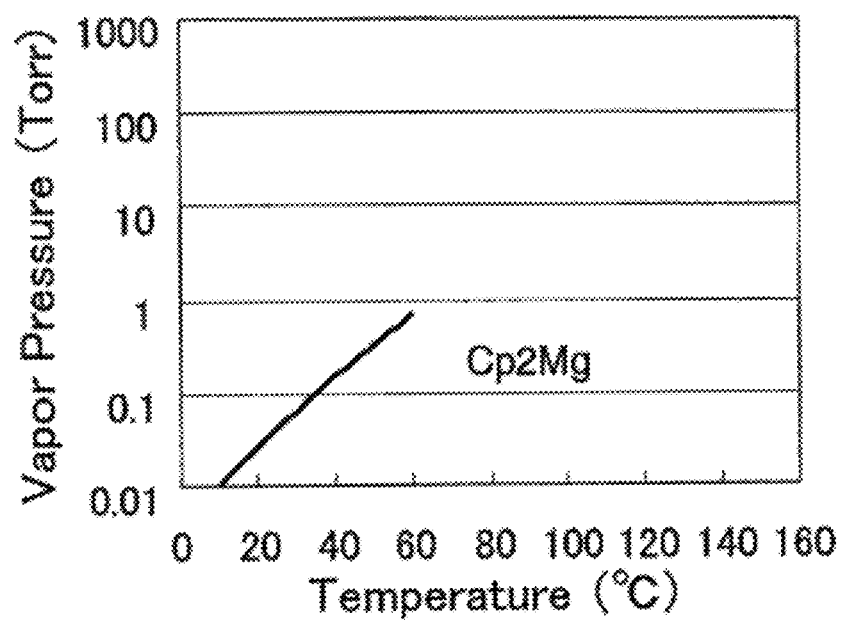
FIG. 7 shows a vapor pressure property of an organometallic material.

The following Table 2 shows the organometallic material of Mg. FIG. 7 shows a vapor pressure property of the material in the following Table 2.

TABLE 2

| Organometallic Material of Mg | |
|---|---|
| Notation | Bis-cyclopentadienyl magnesium $Cp_2Mg$ |
| Structure | $H_5C_5\!-\!Mg\!-\!C_5H_5$ |
| Molecular Weight | 154.5 |

Further, the following Table 3 shows an example of materials used for forming an N-doped ZnO-based compound thin film together with an example of materials used for forming a non-doped ZnO-based thin film. As shown in the following Table 3, using a Mg material, a Cd material, and/or a Mn material together with a Zn material, an N-doped thin film can be formed of a mixed crystal of ZnO with MgO, CdO, and/or MnO (ZnMgO, ZnCdO, ZnMnO, ZnMgCdO, ZnMgMnO, ZnCdMnO, or ZnMgCdMnO).

TABLE 3

| Examples of Materials for Use in Forming Non-Doped or Nitrogen-Doped ZnO-Based Thin Film | | | |
|---|---|---|---|
| | | Mo-Based Material | Gas |
| Non-Doped Film | | | |
| Zn Material | | Material containing DMZn, DEZn, or Zn is usable | $O_2$, $H_2O$ |
| Mixed Crystal Material | Mg | $(C_5H_5)_2Mg$ | |
| | Cd | Material containing Cd | |
| | Mn | Material containing Mn | |
| N-Doped Film | | | |
| Zn Material | | Material containing DMZn, DEZn, or Zn | $NO_2$, $NO_2+N_2$ |
| Mixed Crystal Material | Mg | $(C_5H_5)_2Mg$ | |
| | Cd | Material containing Cd | |
| | Mn | Material containing Mn | |

Next, as a comparative example other than the present invention, description will be made about a case where, as an N-doping reactive gas, a combination of an oxygen gas and a nitrogen gas ($O_2+N_2$), a gas containing oxygen and nitrogen (NO and $O_2+NO$), or the like is used. Using the apparatus in FIG. 5, film formation was performed in the condition shown in the following Table 4, using DMZn as an organometallic material of Zn, Ar as a plasma excitation gas, a ZnO monocrystalline substrate (Zn polar face) as a substrate. It is noted here that the ZnO substrate exhibits n-type conductivity due to residual carriers although it is non-doped. "cc" in the table means a flow rate per minute (hereinbelow, may be referred to as sccm) in a standard condition (0° C., 1 atm (101.325 kPa)) (same in the following description).

TABLE 4

| | |
|---|---|
| DMZn | 0.025 cc |
| Push Ar | 180 cc |
| Microwave Power | 600 W |
| Pressure | 2 Torr |
| Gap between Nozzle and Wafer | 42 mm |
| Stage Temperature | 550° C. |

Respective flow rates of the Ar gas, the oxygen material gas, and the N-doping reactive gas are as shown in the following Table 5.

TABLE 5

| | |
|---|---|
| Ar/O$_2$/N$_2$ | 400 cc/20 cc/100 cc |
| Ar/NO | 400 cc/97 cc |
| Ar/N$_2$O | 400 cc/78 cc |
| Ar/O$_2$/NH$_3$ | 400 cc/50 cc/20 cc |
| Ar/O$_2$/NO | 400 cc/50 cc/50 cc |

Figure 8:
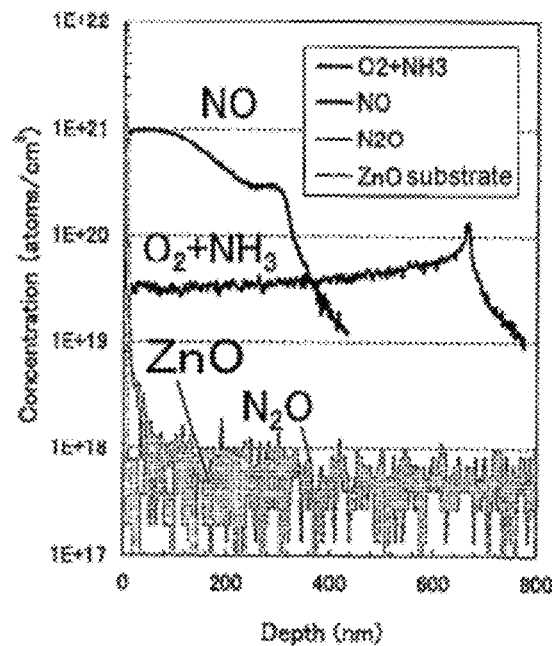
FIG. 8 shows, in (a) and (b), a nitrogen concentration in a ZnO film when the ZnO film is formed by CVD using, as an oxygen material gas and an N-doping reactive gas, an oxygen gas and a nitrogen gas ($O_2+N_2$), a gas containing oxygen and nitrogen (NO, $O_2+NO$), or the like, (a) showing a case of using thermal CVD, (b) showing a case of using microwave-excited plasma CVD.
Figure 8:
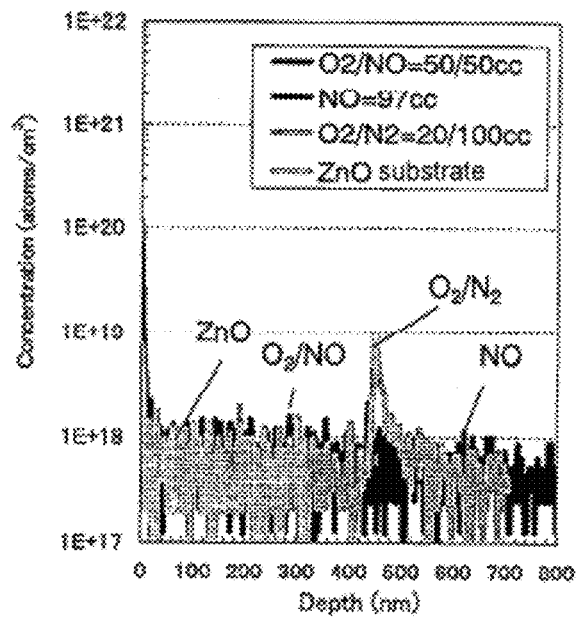

In FIG. 8, (a) and (b) are views showing results of a case where, as an oxygen material gas and an N-doping reactive gas, a combination of an oxygen gas and a nitrogen gas (O$_2$+N$_2$), a gas containing oxygen and nitrogen (NO and O$_2$+NO), or the like is used, that is, nitrogen concentrations in a ZnO film, along with a case of formation by thermal CVD. As shown in FIG. 8 (a), in the thermal CVD, N was contained in the film in cases of NO and NH$_3$. However, as shown in FIG. 8 (b), in CVD film formation of ZnO using a microwave-excited plasma, it was not possible to dope the film with nitrogen. In the CVD film formation of ZnO using a microwave-excited plasma, the film did not grow in a case of N$_2$O and no excellent film was formed in a case of O$_2$/NH$_3$.

Figure 9:
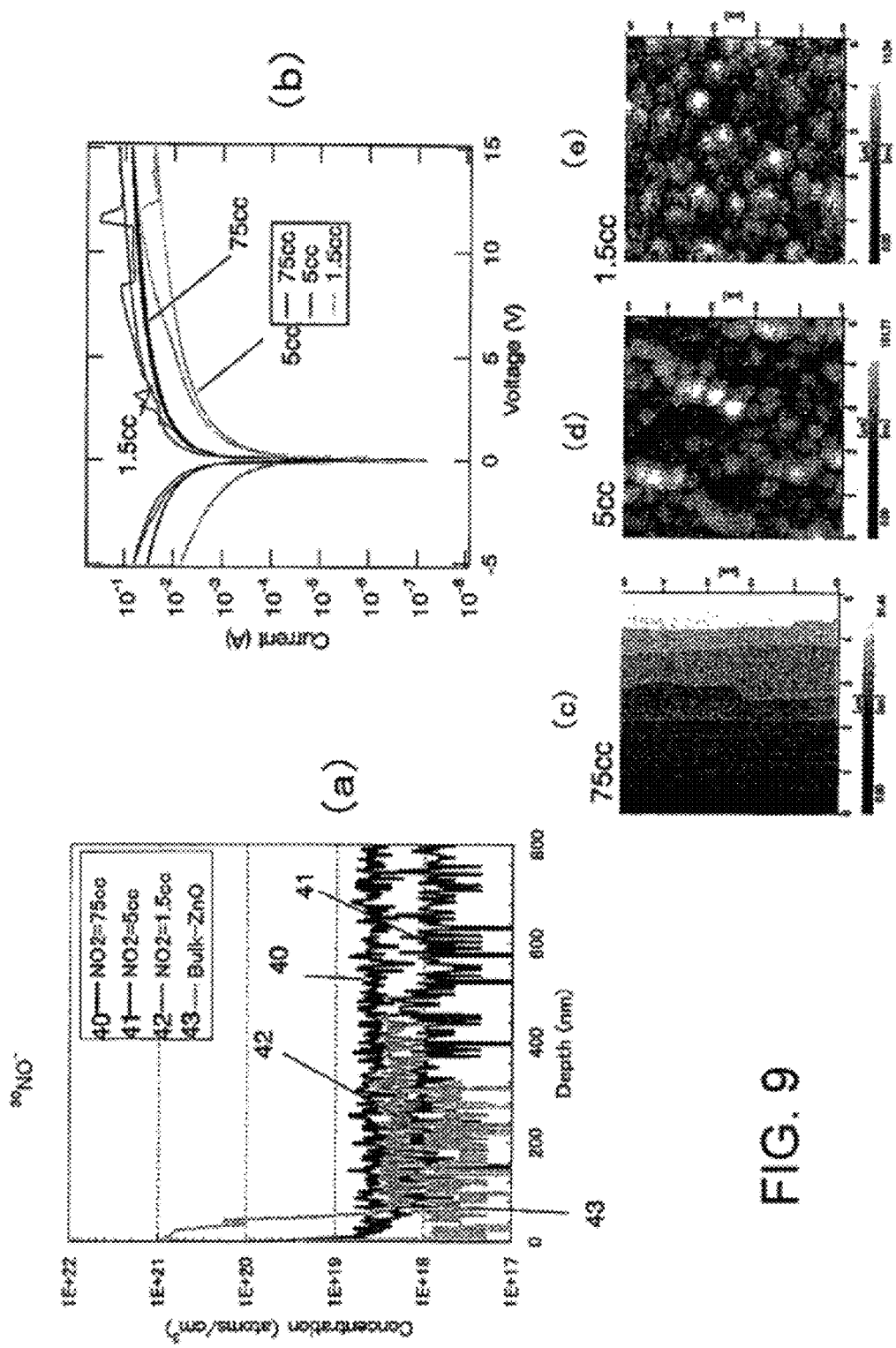
FIG. 9 shows, in (a), (b), (c), (d), and (e), an example of forming a nitrogen-doped ZnO film using a $NO_2$ gas.

On the other hand, in the present invention, consideration has been made of a case where a NO$_2$ gas is used as an N-doping reactive gas in a condition similar to that mentioned above. In FIG. 9, (a), (b), (c), (d), and (e) are views showing an example of forming a nitrogen-doped ZnO film using a NO$_2$ gas. As shown in FIG. 9 (a), when a NO$_2$ gas was used as an oxygen material gas and an N-doping reactive gas, it was found that N was doped in the film as shown in FIG. 9 (a).

As shown in (b), (c), (d), and (e) in FIG. 9, it was also found that, an N-doped amount was increased as a NO$_2$ gas flow rate was reduced to 75 cc, 5 cc, and 1.5 cc with respect to an Ar flow rate of 400 cc. At this time, a rectifying property of a junction between the ZnO film containing nitrogen and an n-type ZnO substrate was measured but was not good. Further, no light emission from the junction was observed.

On the other hand, description will be made of a case where, in the present invention, a nitrogen gas (N$_2$) is added to a NO$_2$ gas as the oxygen material gas and the N-doping reactive gas in the above-described condition.

Figure 10:
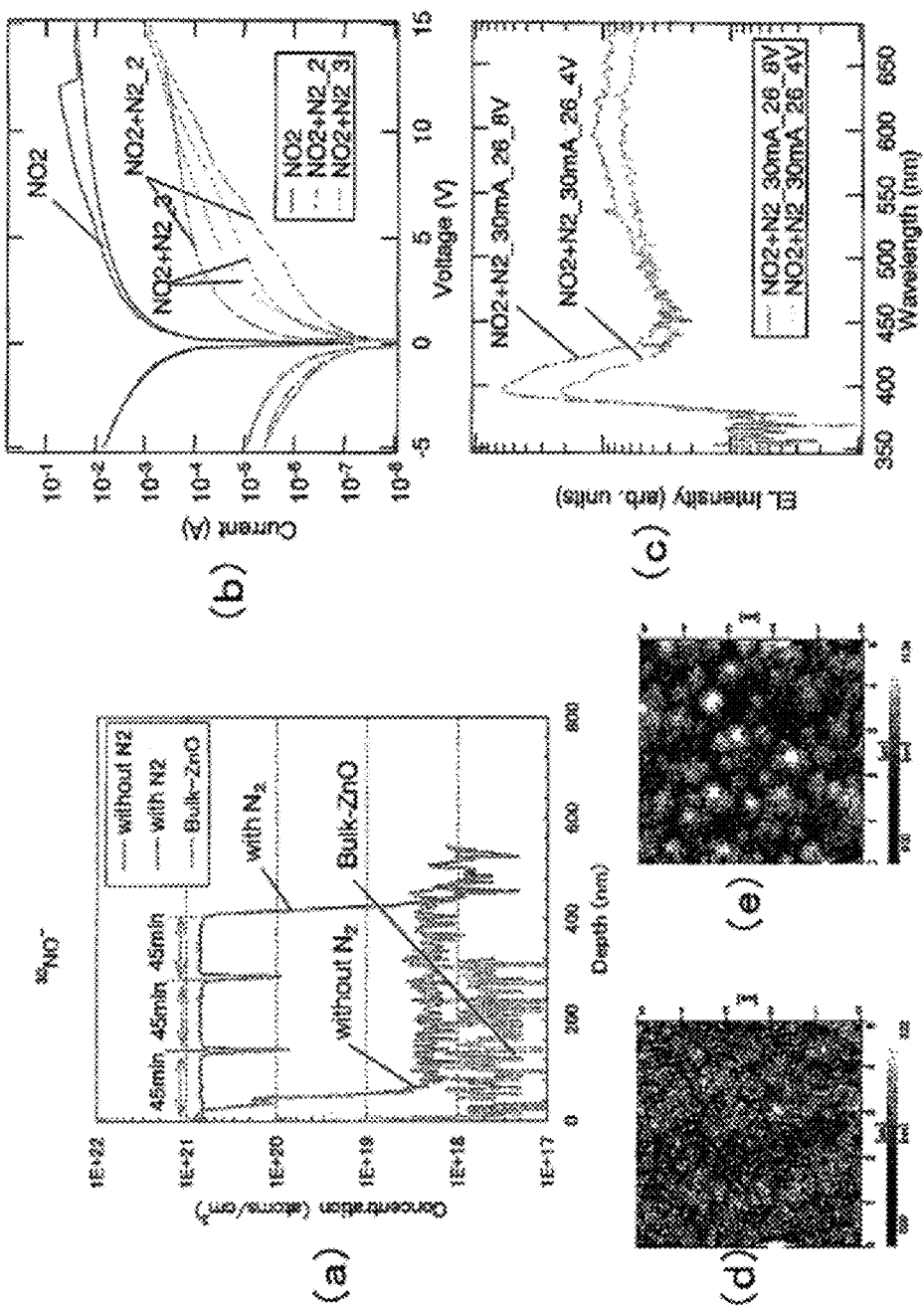
FIG. 10 shows, in (a) to (e), an example of forming a ZnO film, in which, as an oxygen material gas and an N-doping reactive gas in the present invention, a nitrogen gas ($N_2$) is added to a $NO_2$ gas.

In FIG. 10, (a) to (d) are views showing an example of forming a ZnO film, in which, in the present invention, a nitrogen gas (N$_2$) is added to a NO$_2$ gas as the oxygen material gas and the N-doping reactive gas in the above-described condition. In forming the ZnO film, film formation is performed in three separate steps of 45 minutes each. It was found that, as shown in FIG. 10 (a), when a nitrogen gas (N$_2$) was added to a NO$_2$ gas as the oxygen material gas and the N-doping reactive gas, not only the film was doped with N, but also a growth rate was increased. In FIG. 10, (d) and (e) show views copying atomic force microscope photographs of surface structures in cases where N$_2$ is added and is not added, respectively. At this time, a rectifying property of a junction between a grown p-type ZnO film and an n-type ZnO substrate was measured. As a result, an excellent rectifying property was exhibited as shown in FIG. 10 (b) and ultraviolet emission from the pn junction was observed as shown in FIG. 10 (c).

Figure 11:
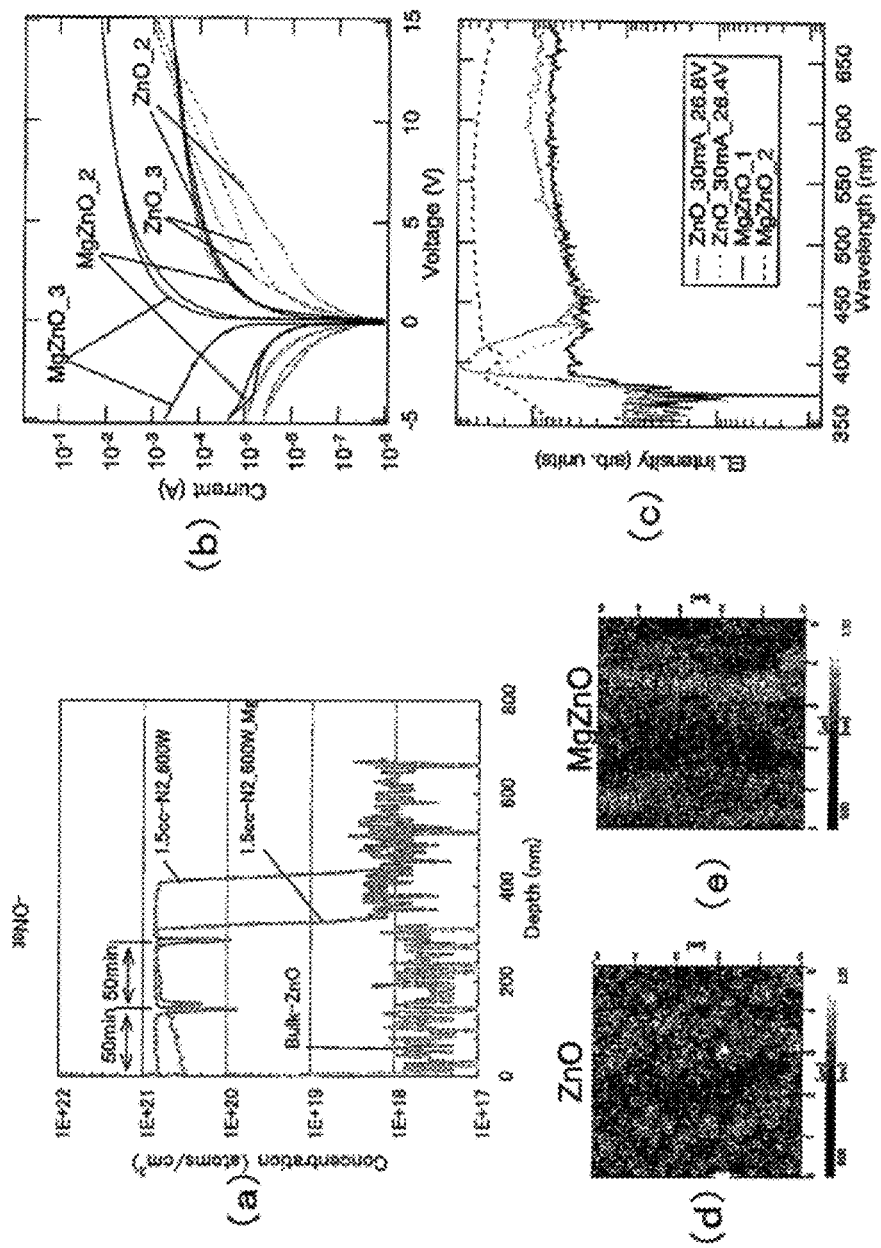
FIG. 11 shows, in (a) to (e), an example of forming a nitrogen-doped MgZnO film using a $NO_2$ gas and a $N_2$ gas.

FIG. 11 shows an example of forming a nitrogen-doped MgZnO film using a NO$_2$ gas and a nitrogen gas. In forming the MgZnO film, film formation is performed in two separate steps of 50 minutes each. As shown in FIG. 11 (a), when the MgZnO film was formed by using, as the oxygen material gas and the N-doping reactive gas, a NO$_2$ gas added with a nitrogen gas, the film was doped with N as expected.

FIG. 11 (d) and FIG. 11 (e) show a ZnO film and a MgZnO film, respectively.

As shown in FIG. 11 (b), an excellent rectifying property was exhibited. As shown in FIG. 11 (c), ultraviolet emission from the pn junction was observed.

Figure 12:
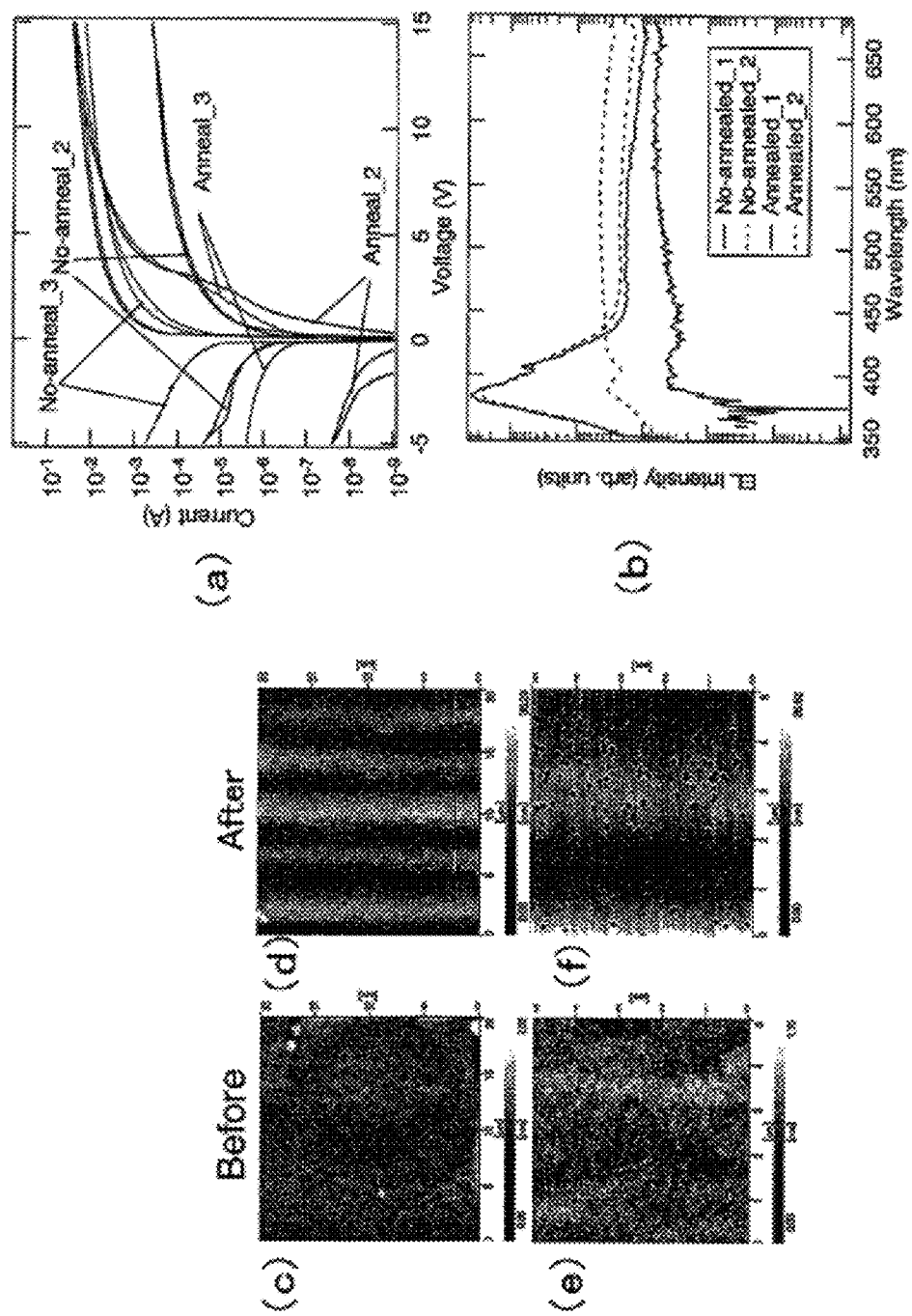
FIG. 12 shows, in (a) to (f), an example of forming a nitrogen-doped MgZn film which is annealed using a $NO_2$ gas and a $N_2$ gas.

In FIG. 12, (a) to (f) are views showing an example of forming a nitrogen-doped MgZn film using a NO$_2$ gas and a nitrogen gas. It was found that, when an N-doped MgZnO film was formed and thereafter annealed in a N$_2$ atmosphere at a temperature of 600° C. for 5 minutes, a rectifying property was improved as shown in FIG. 12 (a) and a light emission property was also improved as shown in FIG. 12 (b). In FIG. 12, (c) and (e) are views copying atomic force microscope photographs showing, at different magnifications, surface structures before annealing. In FIG. 12, (d) and (f) are views copying atomic force microscope photographs showing surface conditions after annealing of the structures in FIGS. 12 (c) and (e) and correspond to (c) and (e) in FIG. 12 also in magnifications, respectively.

Figure 13:
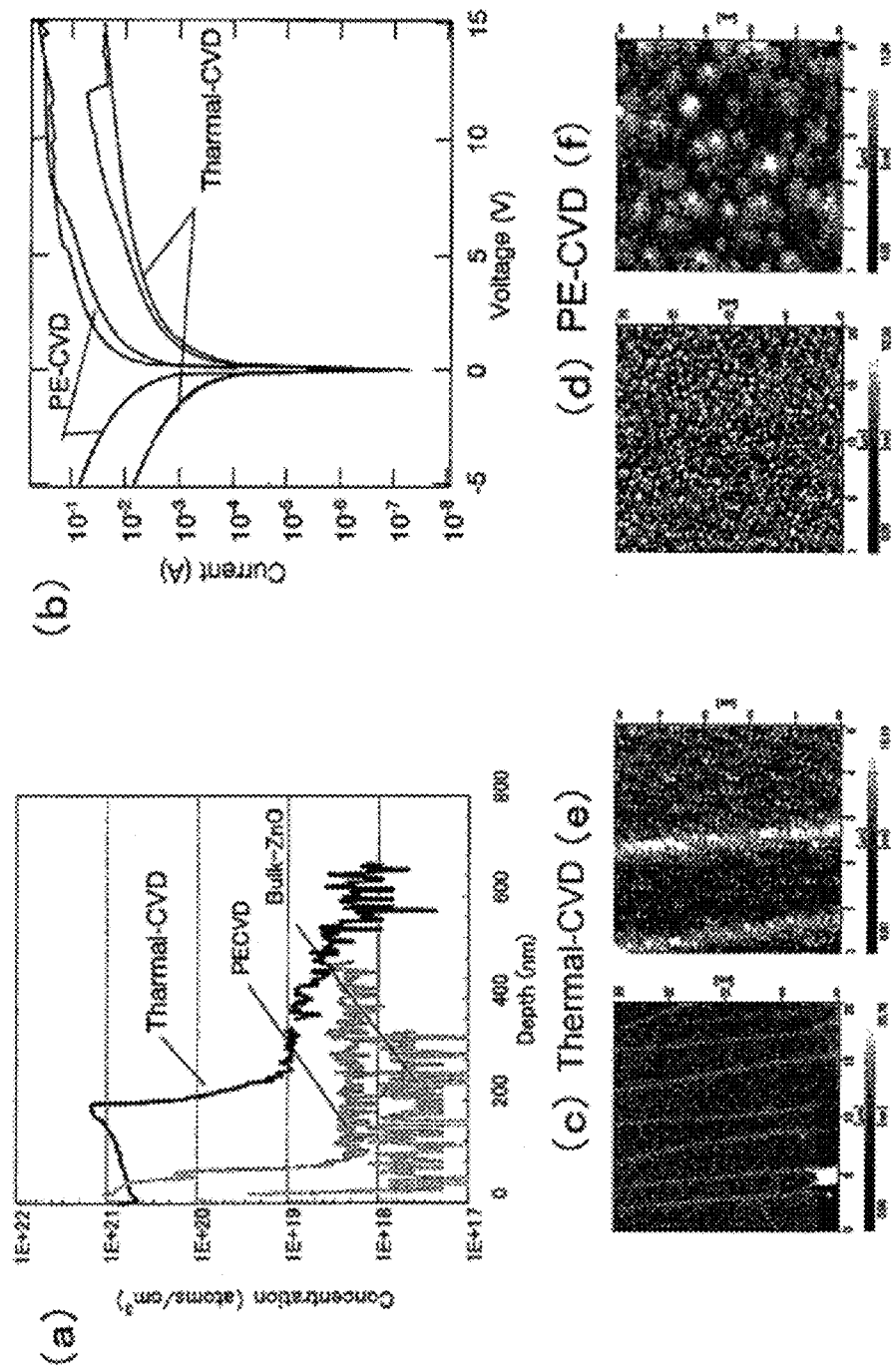
FIG. 13 shows, in (a) to (f), an example of forming a nitrogen-doped ZnO film using a $NO_2$ gas as an N-doping reactive gas.

In FIG. 13, (a) to (e) are views showing an example of forming a nitrogen-doped ZnO film using a NO$_2$ gas as the oxygen material gas and the N-doping reactive gas.

It was found that, as shown in FIG. 13 (a), when a NO$_2$ gas was used as the oxygen material gas and the N-doping reactive gas, the film was doped with N also by thermal CVD, like in PECVD (Plasma-Enhanced Chemical Vapor Deposition). FIG. 13 (b) shows a rectifying property of N-doped ZnO films formed by thermal CVD and PECVD using NO$_2$. It is noted here that no light emission was observed.

In FIG. 13, (c) and (d) are views copying atomic force microscope photographs showing surface structures of N-doped ZnO films by thermal CVD and PECVD, respectively. In FIG. 13, (e) and (f) are views copying atomic force microscope photographs showing (c) and (d) at different magnification. It is confirmed that, when nitrogen is added to the reactive gas in the case of PECVD, further improvement is achieved. This is presumably the same also in thermal CVD.

Figure 14:
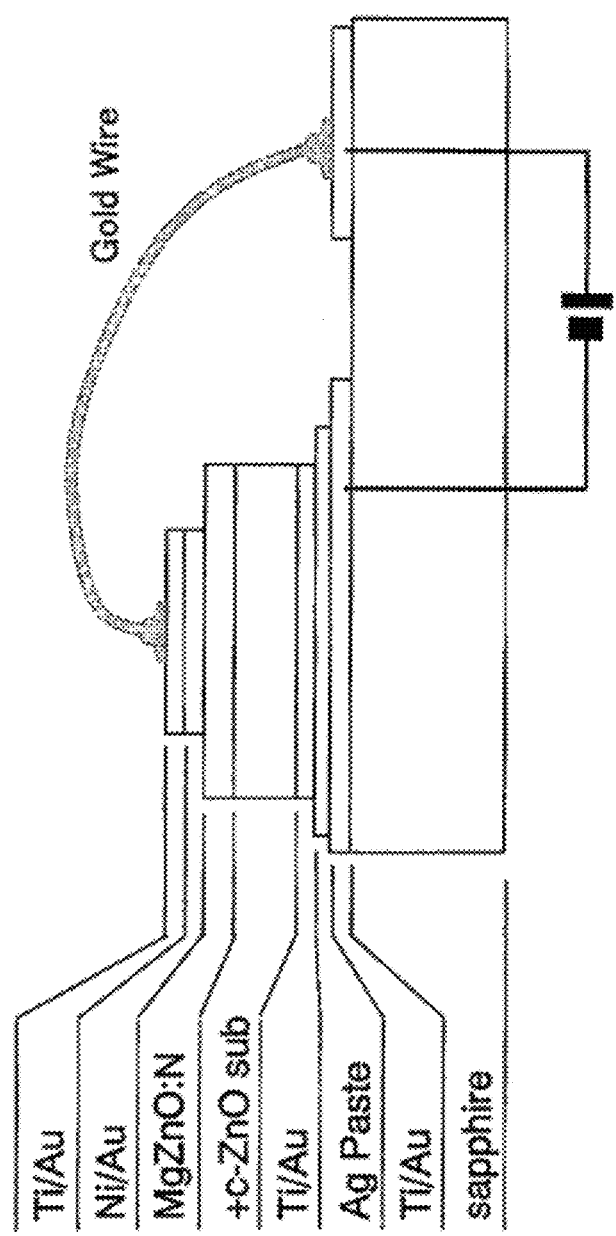
FIG. 14 is a sectional view showing a structure of a light-emitting diode (LED) using an N-doped MgZnO film.
Figure 15:
FIG. 15 is a view copying a photograph showing light emission of the LED shown in FIG. 14.

FIG. 14 is a sectional view showing a structure of a light-emitting diode (LED) using an N-doped MgZnO film. In the LED shown in FIG. 14, light emission was confirmed as shown in FIG. 15.

In the above-described embodiment, description has been made about the case of processing a single substrate having a size with a diameter of 33 mm and provided with a ZnO substrate having a size of 5 mm×5 mm mounted thereon.

Figure 16:
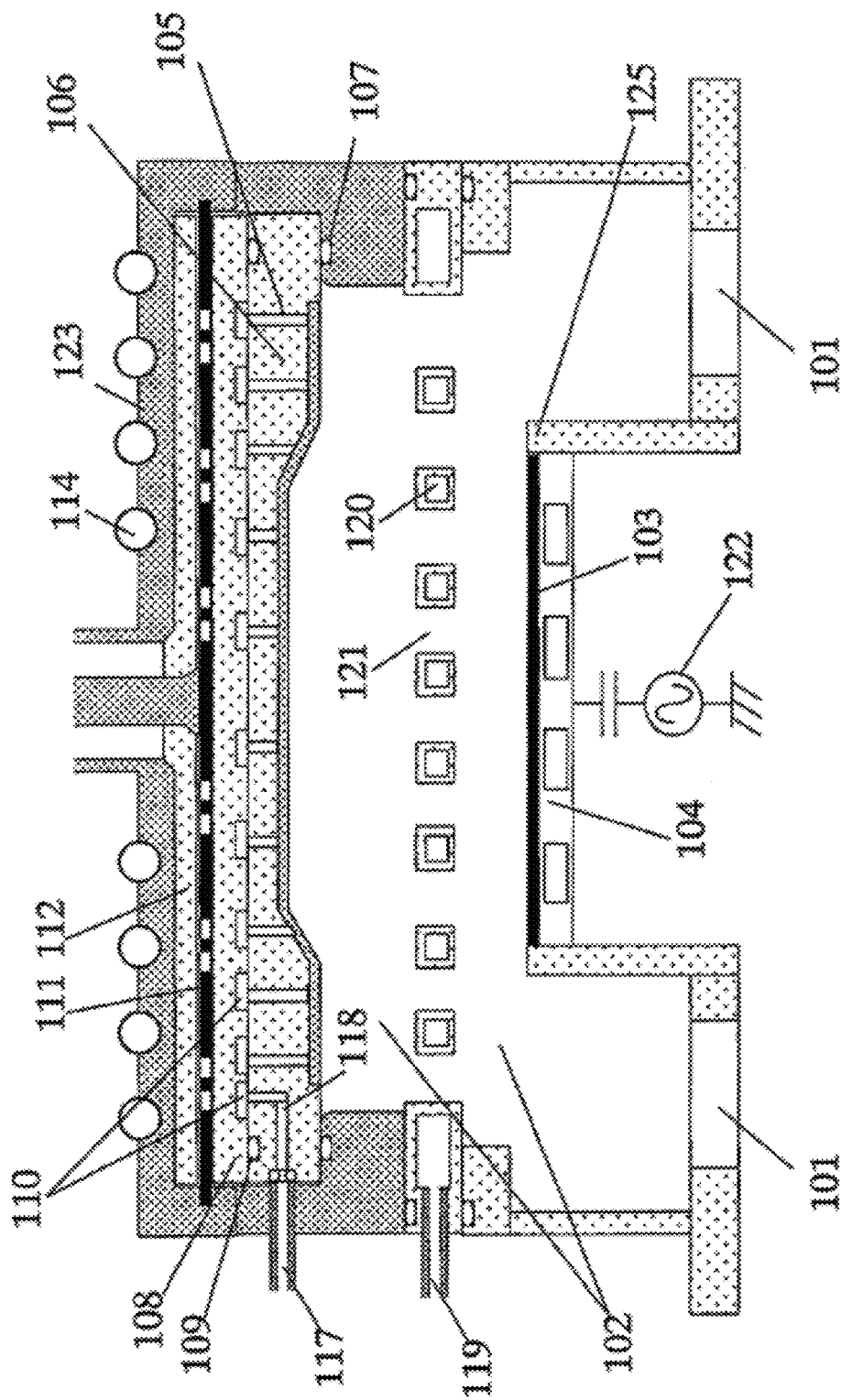
FIG. 16 is a sectional view showing a microwave plasma processing apparatus having a large diameter according to an embodiment of the present invention.

Next, referring to FIG. 16, description will be made about a microwave plasma processing apparatus having a large diameter and capable of increasing a substrate size. FIG. 16 is a sectional view showing the large-diameter microwave plasma processing apparatus according to the embodiment of the present invention.

Referring to FIG. 16, the large-diameter microwave plasma processing apparatus 100 has a process chamber 102 which is sealed at both upper and lower ends thereof and which is evacuated through exhaust ports 101 formed at the lower ends.

At a lower part of the process chamber 102, a holding stage 104 for holding a processing substrate 103 is disposed. For uniformly evacuating the process chamber 102, the process chamber 102 defines a ring-shaped space around the holding stage 104 which is formed at an upper part of a side wall 125 extending upward from a bottom portion and the plurality of exhaust ports 101 are arranged at regular intervals so as to communicate with the space, i.e., axisymmetrically to the processing substrate 103. With this arrangement of the exhaust ports 101, the process chamber 102 can be uniformly evacuated through the exhaust ports 101. A reference numeral 122 represents a high-frequency oscillator.

Above the process chamber 102, at a position corresponding to the processing substrate 103 on the holding stage 104, a plate-shaped shower plate 106 made of dielectric alumina and formed with a number of (238) openings, i.e., gas ejection holes 105, is attached through a seal ring 107 as a part of an outer wall of the process chamber 102, thereby forming an upper shower plate. Further, to the process chamber 102, a cover plate 108 made of alumina is attached through another seal ring 109 on the outer side of the shower plate 106, i.e., on the side opposite to the holding stage 104 with respect to the shower plate 106. Further thereon, a cover portion 123 is provided through a support portion 111 and an insulating plate 112. The cover portion 123 is provided with cooling pipes 114. Between an upper surface of the shower plate 106 and the cover plate 108, spaces 110 for filling a plasma excitation gas therein are formed. The gas ejection holes 105 are arranged at positions corresponding to the spaces 110.

Further, the illustrated microwave plasma processing apparatus has a lattice-shaped shower plate as a lower shower plate 120 below the plate-shaped shower plate 106. The shower plate 120 is connected to a lower gas introduction pipe 119.

Figure 17:
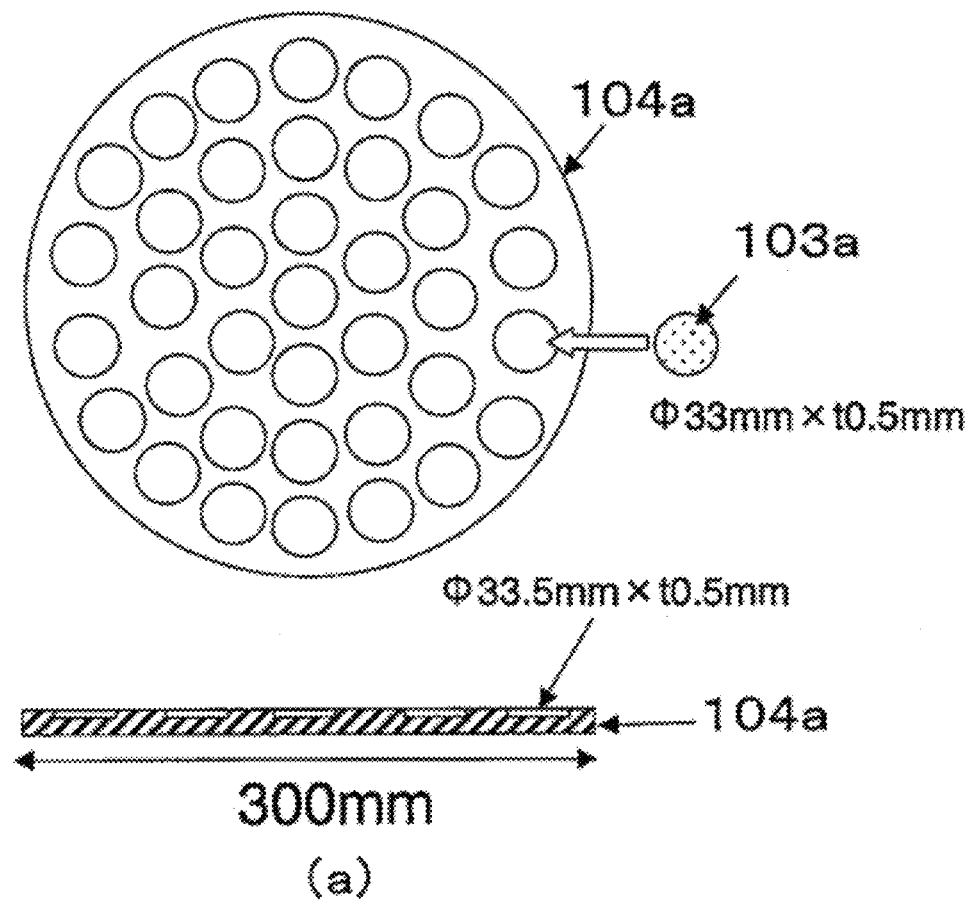
FIG. 17 shows, in an upper view of (a), a plan view of a large-diameter susceptor in FIG. 16 and, in a lower view, a side sectional view thereof. (b) is a partially-cutaway perspective view showing a microwave radiation antenna (radial line slot antenna) in FIG. 16.
Figure 17:
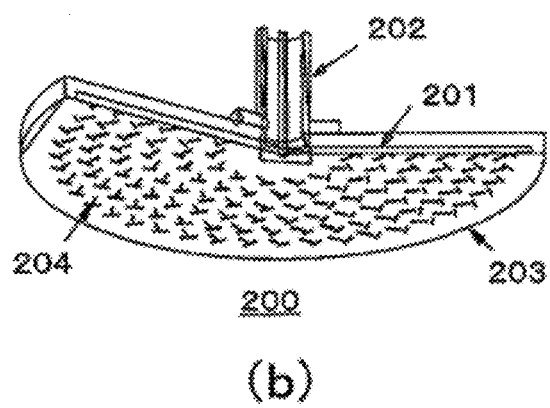

Further, an upper view of FIG. 17 (a) is a plan view showing a large-diameter susceptor in FIG. 16, a lower view is a side sectional view thereof, and FIG. 17 (b) is a partially-cutaway perspective view showing a microwave radiation antenna in FIG. 16. By preparing the large-diameter susceptor 104a as the above-mentioned holding stage 104, it is possible to process a plurality of substrates, for example, wafers 103a each having a diameter of 33 mm and a thickness of 0.5 mm, at a time as shown in FIG. 17 (a).

In this case, for uniform irradiation of a microwave over a wide range, it is effective to use a radial line slot antenna 200 shown in FIG. 17 (b). The radial line slot antenna 200 shown in FIG. 17 (b) was invented by N. Goto in 1980.

Figure 18:
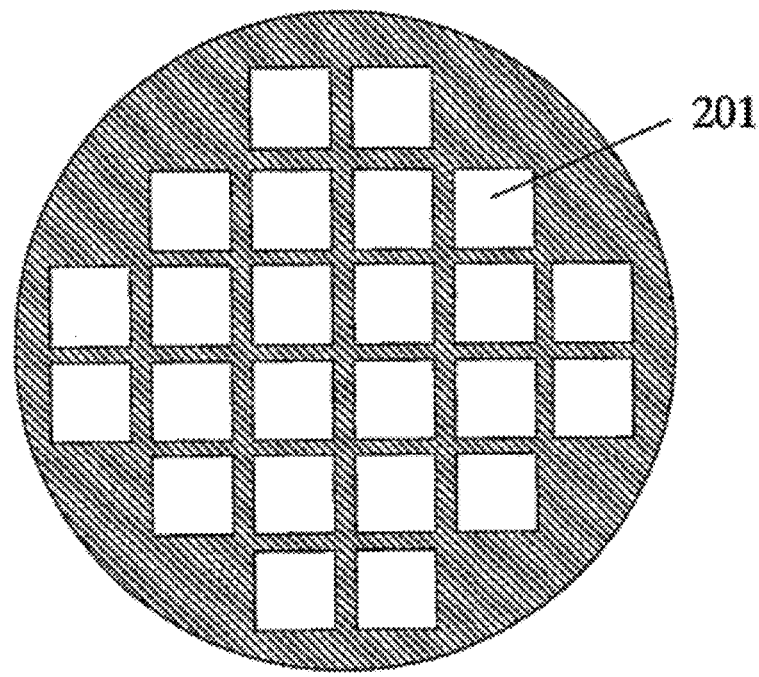
FIG. 18 shows, in (a) and (b), plan views of examples of a large-diameter lower shower plate.
Figure 18:
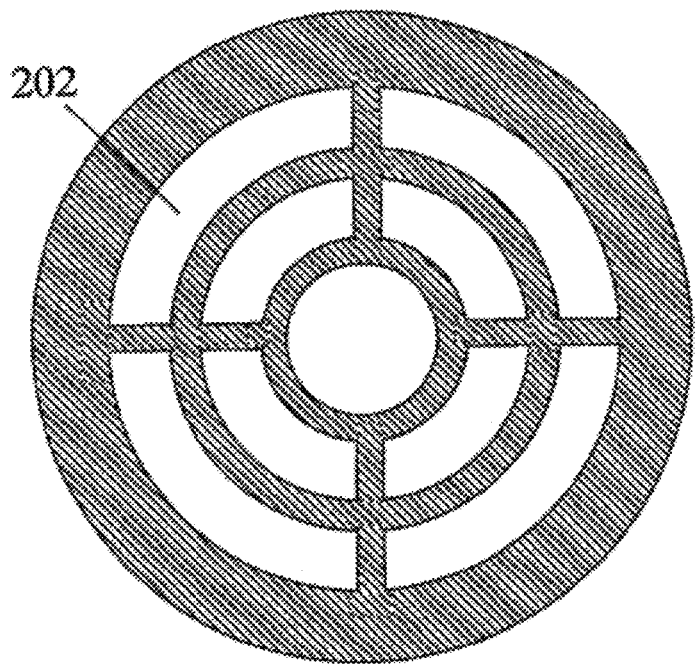

In FIG. 18, (a) and (b) are plan views showing examples of a large-diameter lower shower plate. By using each of the lower shower plates 201 and 202 as shown in (a) and (b) in FIG. 18 instead of the lower shower nozzle 4 shown in FIG. 1, it is possible to uniformly eject a material gas. In each of the lower shower plates 201 and 202, a hatched portion has a gas flow path inside and a number of gas ejection ports (not shown in the figure) communicating with the gas flow path and directed toward the substrate. Non-hatched portions serve as opening portions through which a plasma passes toward the substrate.

Figure 19:
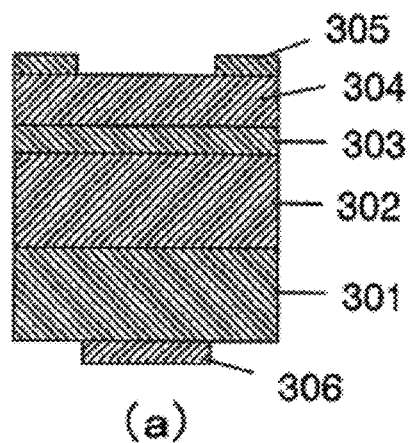
FIG. 19 shows, in (a) to (c), sectional views of various examples of a semiconductor light-emitting element having a Zn-based thin film formed by the method of the present invention.
Figure 19:
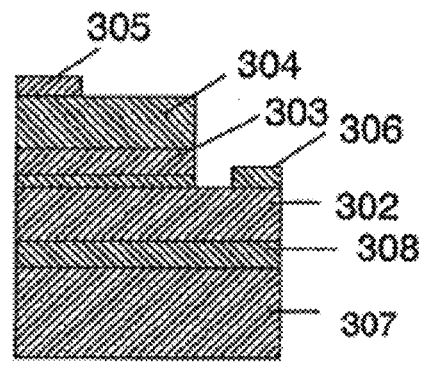
Figure 19:
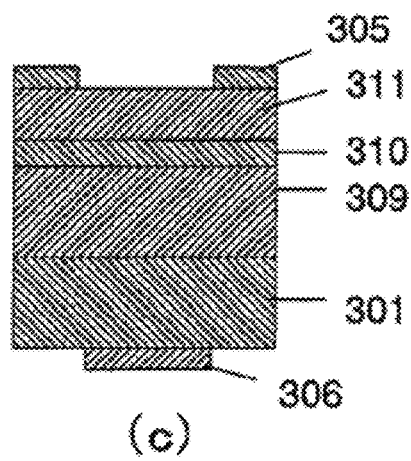

In FIG. 19, (a) to (c) are sectional views showing various examples of a semiconductor light-emitting element having a Zn-based thin film formed by the method of the present invention. Referring to FIG. 19 (a), one example of the semiconductor light-emitting element according to the present invention is formed by forming an n-type ZnO film 302, a ZnO film 303, and a p-type ZnO film 304 on a ZnO substrate 301 by the method according to the present invention.

Using the microwave plasma processing apparatus shown in FIG. 1 or FIG. 16, the n-type ZnO film 302, the ZnO film 303, and the p-type ZnO film 304 illustrated in the figure can continuously be formed by switching a gas. In the illustrated semiconductor light-emitting element, an electrode (n-electrode) 306 and an electrode (p-electrode) 305 are formed on the ZnO substrate 301 and the p-type ZnO thin film 304, respectively.

FIG. 19 (b) shows a semiconductor light-emitting element using a sapphire substrate 307. The illustrated semiconductor light-emitting element has a structure in which a low-temperature ZnO buffer film 308 is formed on the sapphire substrate 307 and, over the low-temperature ZnO buffer film 308, an n-type ZnO film 302, a ZnO film 303, and a p-type ZnO film 304 are formed like in FIG. 19 (a). In this example, an n-electrode 306 and a p-electrode 305 are formed on the n-type ZnO film 302 and the p-type ZnO film 304, respectively. The semiconductor element shown in FIG. 19 (b) has the low-temperature ZnO buffer film 308, the n-type ZnO film 302, the ZnO film 303, and the p-type ZnO film 304 and these films can continuously be formed using the microwave plasma processing apparatus shown in FIG. 1 or the like.

Further, FIG. 19 (c) shows a semiconductor light-emitting element obtained by continuously forming an n-type ZnMgO film 309, a ZnO film 310, and a p-type ZnMgO film 311 on a ZnO substrate 301 by the microwave plasma processing apparatus according to the present invention. In this example, a p-electrode 305 and an n-electrode 306 are formed on the p-type ZnMgO film 311 and the ZnO substrate 301, respectively.

Figure 20:
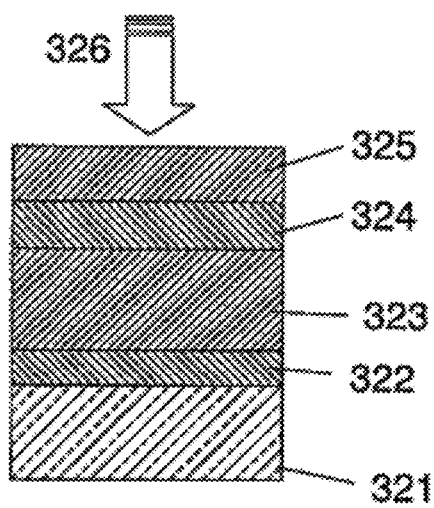
FIG. 20 shows an example of a solar cell manufactured using the thin film forming method according to the present invention.

FIG. 20 is a view showing an example of a solar cell produced using the thin film forming method according to the present invention. Referring to FIG. 20, the solar cell comprises a glass substrate 321, a Mo electrode 322, a Cu(In, Ga)Se$_2$ film 323, a ZnO film 324, and a transparent conductive film 325. Herein, the illustrated transparent conductive film 325 is formed of GaZnO. In the solar cell having such a structure, the Cu(In, Ga)Se$_2$ film 323, the ZnO film 324, and the transparent conductive film 325 can continuously be formed by the above-described microwave plasma processing apparatus. In the illustrated solar cell, sunlight 326 enters from the side of the transparent conductive film 325 formed of GaZnO.

Figure 21:
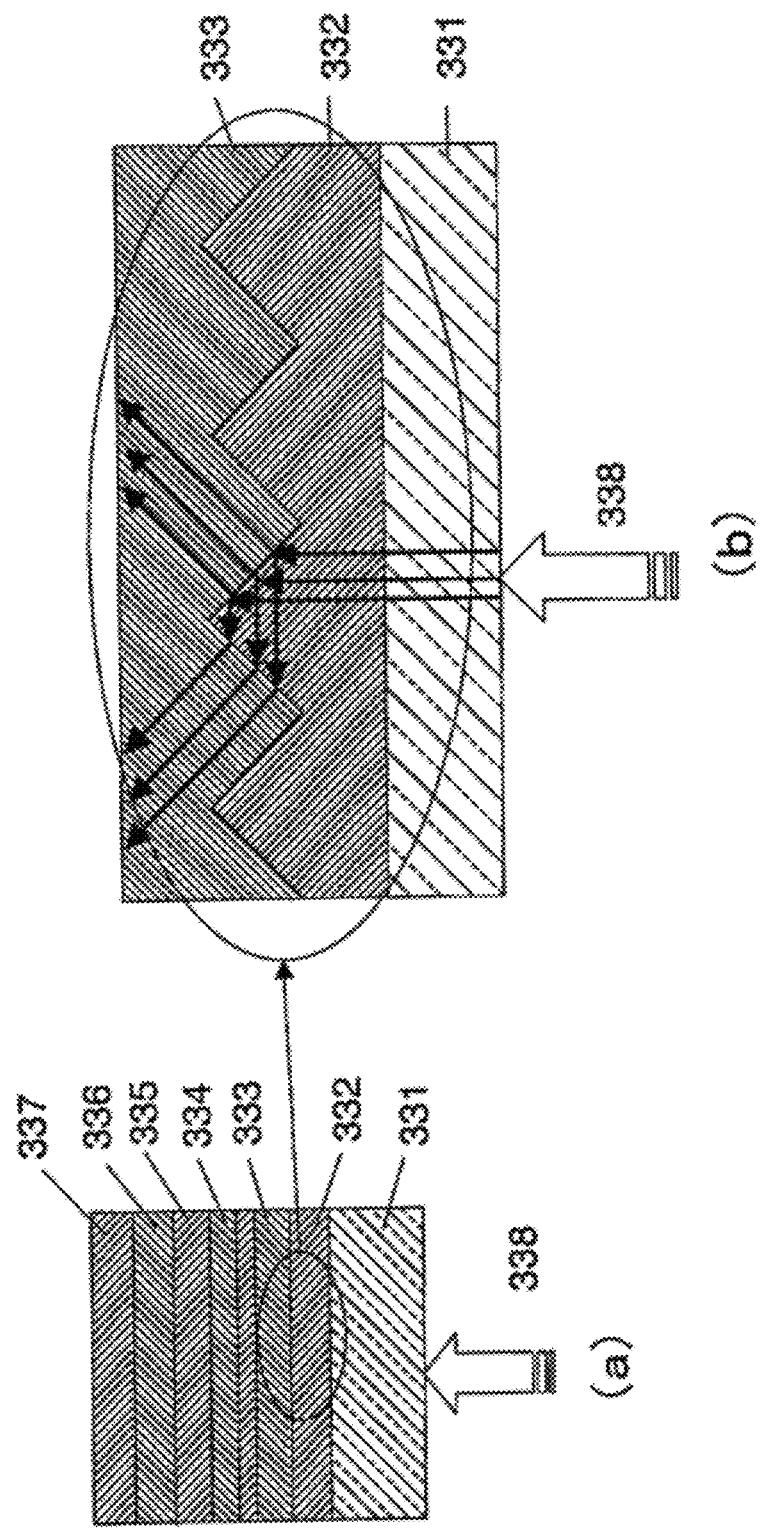
FIG. 21 shows, in (a), a sectional view of another example of a solar cell manufactured using the thin film forming method according to the present invention and, in (b), an enlarged sectional view of a part of (a).

FIG. 21 (a) is a sectional view showing another example of a solar cell produced using the thin film forming method according to the present invention. FIG. 21 (b) is an enlarged sectional view of a part of FIG. 21 (a).

Referring to FIG. 21 (a), the solar cell comprises a glass substrate 331, a transparent electrode 332 formed of GaZnO or AlZnO, a p-polysilicon film 333, an i-polysilicon film 334, an n-polysilicon film 335, a transparent electrode 336 formed of GaZnO or AlZnO, and a Mo electrode 337. Among them, those components from the transparent electrode 332 to the transparent electrode 336 can continuously be formed in the microwave plasma processing apparatus shown in FIG. 1 or the like. In the solar cell with this structure, sunlight 338 enters from the glass substrate 331 side.

In the illustrated structure, when the polysilicon films as upper layers are formed, the ZnO-based transparent conductive film 332 serves as a film having high plasma resistance. Further, a surface structure can be controlled by film forming conditions and, as in the enlarged view shown in FIG. 21 (b), it is also possible to form roughness on surfaces of the transparent electrode 332 and the polysilicon film 333. According to this structure, it is possible to form a film surface with a long optical path length and thus with a light confinement effect.

Figure 22:
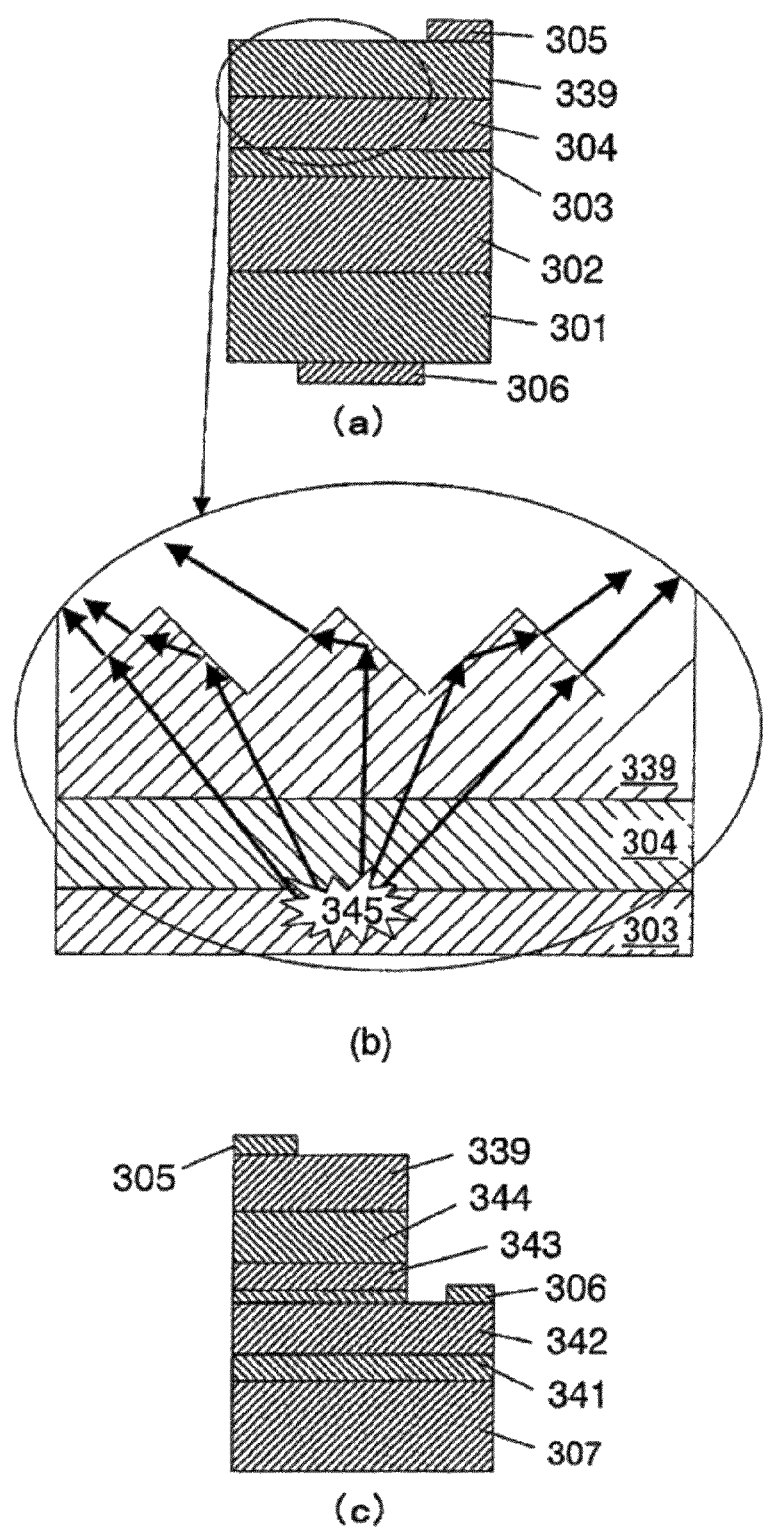
FIG. 22 shows sectional views of an example of another electronic device having a transparent conductive film according to the present invention, (a) showing a light-emitting element having a ZnO-based transparent conductive film, (b) being an enlarged sectional view of a part of (a), (c) showing a light-emitting element having an InGaN-based transparent conductive film.

FIG. 22 shows sectional views illustrating examples of other electronic devices having a transparent conductive film according to the present invention. FIG. 22 (a) shows a light-emitting element having a ZnO-based transparent conductive film and FIG. 22 (b) is an enlarged sectional view of a part of FIG. 22 (a). The light-emitting element in FIG. 22 (a) comprises a ZnO substrate 301, an n-type ZnO film 302, a ZnO film 303, and a p-type ZnO film 304 like the light-emitting element in FIG. 19 (a), and further comprises a transparent electrode 339 formed of GaZnO or AlZnO. Further, a p-electrode 305 and an n-electrode 306 are formed on the transparent electrode 339 and the ZnO substrate 301, respectively. In this case, using the same microwave plasma processing apparatus, the thin films from the n-type ZnO film 302 to the transparent electrode 339 can continuously be formed by sequentially switching a gas depending on the thin film. In the thin film forming method according to the present invention, since a low-electron-temperature plasma is used as described above, damage to a lower layer is small in film formation so that the light emission characteristics become excellent.

Further, as shown in FIG. 22 (b), it is possible to form roughness on a surface by selecting the film forming conditions. It is therefore possible to achieve a surface structure having a high extraction efficiency of spontaneous light 345. FIG. 22 (c) is a sectional view showing an InGaN-based light-emitting element as one example of an electronic device. Referring to FIG. 22 (c), the InGaN-based light-emitting element comprises a sapphire substrate 307, a low-temperature GaN buffer film 341, an n-type GaN film 342, an MQW (multiple quantum well) film 343 formed of InGaN/GaN, a p-type GaN film 344, and a transparent electrode 339 formed of GaZnO or AlZnO. The thin films from the low-temperature GaN buffer film 341 to the transparent electrode 339 of the light-emitting element of this structure can continuously be formed using the microwave plasma processing apparatus shown in FIG. 1 or the like.

Figure 23:
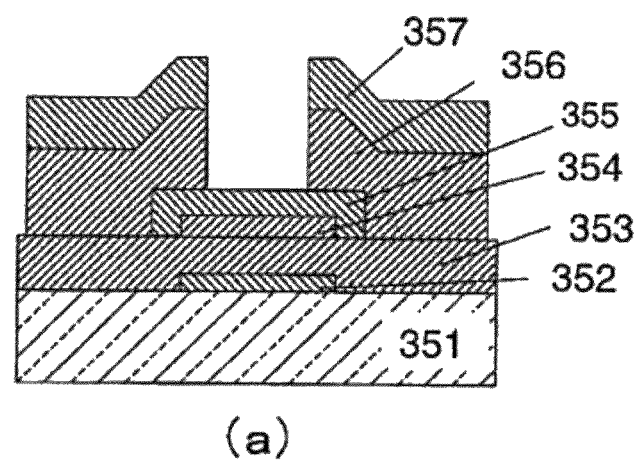
FIG. 23 shows examples of a semiconductor device having, in a channel region, a ZnO-based thin film manufactured using the thin film forming method according to the present invention.
Figure 23:
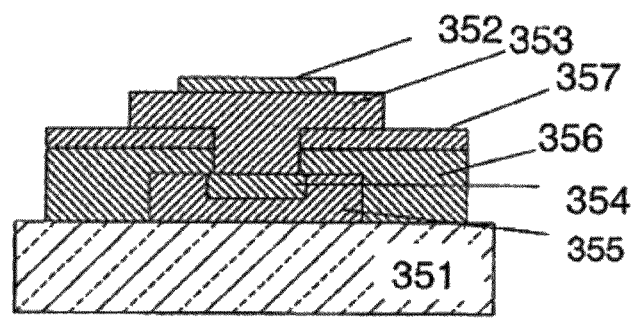

In FIG. 23, (a) and (b) are sectional views showing examples of a ZnO-type thin film transistor produced using the thin film forming method according to the present invention. The thin film transistor shown in FIG. 23 (a) has a gate electrode 352 selectively formed on a surface of a glass substrate 351 and a gate insulating film 353 formed so as to cover the gate electrode 352. Further, the illustrated thin film transistor has a ZnO film 355 selectively formed on the gate insulating film 353, n-ZnO films 356 formed with an interval therebetween on the ZnO film 355, and source and drain electrodes 357. Herein, in the ZnO film 355, a channel 354 is formed during operation of the thin film transistor.

The ZnO film 355 defining the channel 354 and the n-ZnO films 356 can be formed using the microwave plasma processing apparatus shown in FIG. 1 or the like.

On the other hand, the thin film transistor shown in FIG. 23 (b) comprises a glass substrate 351, a ZnO film 355 selectively formed on the glass substrate 351, n-ZnO films 356 arranged with an interval therebetween on the ZnO film 355, and source and drain electrodes 357 formed on the n-ZnO films 356. Further, the thin film transistor has a gate insulating film 353 provided between the source and drain electrodes 357 so as to be in contact with the ZnO film 355, and a gate electrode 352 disposed on the gate insulating film 353.

Also in the thin film transistor of this structure, a channel 354 is formed in the ZnO film 355 during operation. The ZnO film 355 and the n-ZnO film 356 illustrated in the figure can be formed by the above-described microwave plasma processing apparatus.

As described above, the thin film forming method according to the present invention is also applicable in order to manufacture an electronic device having a ZnO-based thin film in a channel region. In this case, by using a low-electron-temperature high-density plasma, it is possible to form a channel region of a thin film transistor by a high-quality ZnO thin film excellent in carrier mobility.

Figure 24:
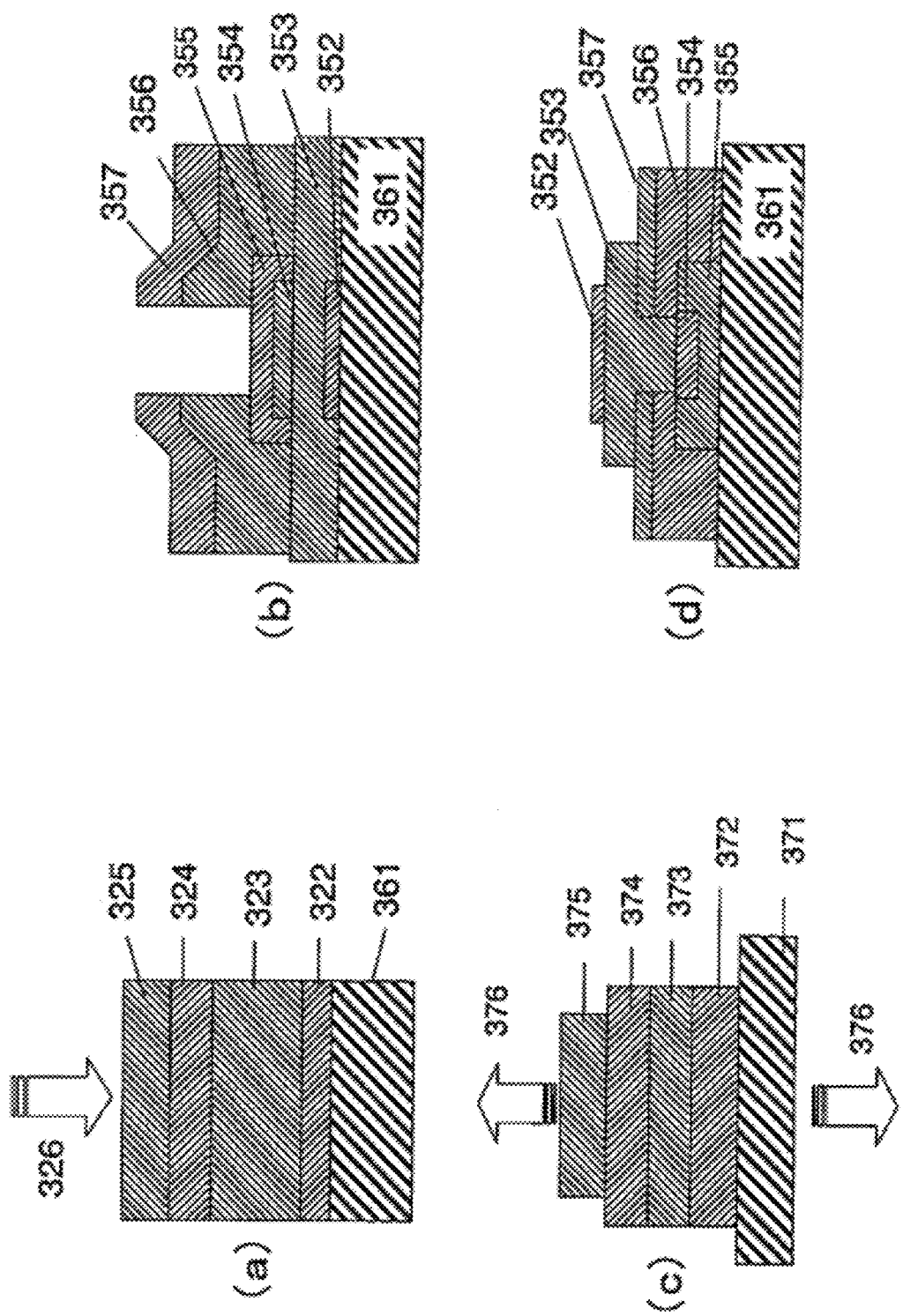
FIG. 24 shows, in (a) to (d), sectional views showing various examples of an electronic device having a resin substrate or the like of a material having a heat resistance temperature of 200° C. or higher and manufactured by the thin film forming method of the present invention, (a), (b), (c), and (d) showing a solar cell formed on a resin substrate 361, a ZnO-based thin film transistor, an organic EL (Electro Luminescence) element, and a ZnO-based thin film transistor, respectively.

In FIG. 24, (a) to (d) are sectional views showing various examples of an electronic device having a resin substrate of a material having a heat resistance temperature not higher than 200° C. and so on and produced by the thin film forming method of the present invention. FIG. 24 (a), FIG. 24 (b), FIG. 24 (c), and FIG. 24 (d) respectively show a solar cell, a ZnO-based thin film transistor, an organic EL element, and a ZnO-based thin film transistor each formed on a resin substrate 361 or 371.

As the resin substrate, use may be made of a plastic substrate or a plastic film of PET (polyethylene terephthalate), polycarbonate, or the like.

Referring to (a), (b), (c), and (d) in FIG. 24, the solar cell, the ZnO-based thin film transistor, the organic EL, and the ZnO-based thin film transistor each formed on the resin substrate 361 or 371 are shown, respectively.

The solar cell shown in FIG. 24 (a) is similar to the solar cell shown in FIG. 21 except that the resin substrate 361 is used. The ZnO-based thin film transistor shown in FIG. 24 (b) is similar to the ZnO-based thin film transistor shown in FIG. 23 (a) except that the resin substrate 361 is used.

Further, the organic EL shown in FIG. 24 (c) comprises a resin substrate 371, a GZO film 372, a hole injection layer 373, an electron injection light-emitting layer 374, and a GZO film 375. The illustrated organic EL shows an example of emitting light 376 in both upward and downward directions. Also in this case, the thin film forming method of the present invention is applicable to formation of the GZO films 372 and 375.

The ZnO-based thin film transistor shown in FIG. 24 (d) is similar to the ZnO-based thin film transistor shown in FIG. 23 (b) except that the resin substrate 361 is used.

Conventionally, it was difficult to form a high-quality thin film on a resin at a low temperature and thus it was difficult to manufacture an electronic device on the resin. However, in the present invention, by using a low-electron-temperature high-density plasma, it is possible to form a high-quality thin film at a low temperature and thus it is possible to form various types of electronic devices on the resin as shown in (a) to (d) in FIG. 24.

Industrial Applicability

As described above, the thin film formed of an N-doped ZnO-based compound and its manufacturing method according to the present invention are optimum for an electronic device, such as a light-emitting element having a high light emission efficiency, a solar cell, a display, a display system, and a thin film transistor, each having a high efficiency, and for an electronic device, such as a solar cell, a display, a display system, a light-emitting element, and a semiconductor device, each comprising a substrate of a material having a low heat resistance.

This application is based upon and claims the benefit of priority from Japanese patent application No. 2009-235346, filed on Oct. 9, 2009, the disclosure of which is incorporated herein in its entirety by reference.

DESCRIPTION OF REFERENCE NUMERALS 1 plasma processing apparatus
2 insulator plate
3, 4 shower plate
5 introduction pipe
6 introduction pipe
7 substrate
8 organometallic material supply system
9 MO (Metal Organic) container
10 MO container
11 process chamber
12 exhaust system
13 stage
14, 15 temperature control heater
16 probe
17 probe
18 partition plate
21 gas pipe
22 gas pipe 23 temperature control liquid pipe (for going)
24 temperature control liquid pipe (for return)
25 thermocouple
26 cover
27, 28 hole
31 carrier gas
32 push gas
33 flow rate controller
34, 35, 37 valve
36 pressure regulator
40 microwave
42 upper gas
101 exhaust port
102 process chamber
103 processing substrate
104 holding stage
105 gas ejection hole
106 (upper) shower plate
107 seal ring
108 cover plate
109 seal ring
110 space
120 (lower) shower plate
122 high-frequency oscillator
200 radial line slot antenna
201 insulating plate
202 coaxial waveguide
203 slot plate
204 slot
301 ZnO substrate
302 n-type ZnO film
303 ZnO film
304 p-type ZnO film
305 p-electrode
306 n-electrode
307 sapphire substrate
308 low-temperature ZnO buffer film
309 n-type ZnMgO film
310 ZnO film
311 p-type ZnMgO film
321 glass substrate
322 electrode
323 Cu(In,Ga)Se$_2$ film
324 ZnO film
325 transparent conductive film
326 sunlight
331 glass substrate
332 transparent electrode
333 p-polysilicon film
334 i-polysilicon film
335 n-polysilicon film
336 transparent electrode
337 Mo electrode
338 sunlight
339 transparent electrode
341 low-temperature GaN buffer film
342 n-type GaN film
343 MQW (multiple quantum well)
344 p-type GaN film
345 spontaneous light
351 glass substrate
352 gate electrode
353 gate insulating film
354 channel region
355 ZnO film
356 n-ZnO film
357 source and drain electrodes
361, 371 resin substrate
372 GZO (gallium-added zinc oxide) film
373 hole injection layer
374 electron injection light-emitting layer
375 GZO film
376 spontaneous light

The invention claimed is:

1. A thin film forming method comprising supplying a gas including a nitrogen dioxide (NO$_2$) gas, a nitrogen (N$_2$) gas, and an organometallic material gas containing at least Zn into a plasma generated using a microwave-excited high-density plasma generator, thereby forming, on a film forming object, at least a nitrogen (N)-doped ZnO-based compound thin film.

2. The thin film forming method as claimed in claim 1, comprising further supplying an organometallic material gas containing Mg into the plasma, thereby forming, on the film forming object, a thin film of a nitrogen (N)-doped and Mg-added ZnO-based compound.

3. A thin film forming method comprising supplying an organometallic material gas containing at least Zn and a gas containing a nitrogen dioxide (NO$_2$ )gas and a nitrogen (N$_2$) gas into a plasma generated using a microwave-excited high-density plasma generator, thereby forming, on a film forming object, at least a nitrogen (N)-doped ZnO-based compound thin film, and annealing, after formation of the thin film, the thin film at a temperature of 400° C. or higher in an atmosphere containing no hydrogen.

4. A thin film forming method comprising supplying an organometallic material gas containing at least Zn and a gas containing a nitrogen dioxide (NO$_2$) gas and a nitrogen (N$_2$) gas into a plasma generated using a microwave-excited high-density plasma generator, thereby forming, on a film forming object, at least a nitrogen (N)-doped Zn-O-based compound thin film,
and during formation of the thin film, applying a bias potential to the film forming object to irradiate a surface of the film with ions in the plasma.

5. The thin film forming method as claimed in claim 4, comprising setting the bias potential to be applied to a potential such that a photoluminescence property of the formed thin film is improved as compared with a case of applying no bias potential.

6. The thin film forming method as claimed in claim 4, comprising setting the bias potential to be applied to a potential such that, in the formed thin film, a photoluminescence intensity of band-edge emission at a bandgap inherent to a material is increased and an intensity of emission at other levels is reduced as compared with a case of applying no bias potential.

7. The thin film forming method as claimed in claim 4, comprising setting the bias potential to be applied to a potential such that a film structure of the formed thin film is improved in flatness as compared with a case of applying no bias potential.

8. A thin film wherein the thin film is formed using the thin film forming method claimed in claim 1 and contains mainly p-type ZnO.

9. The thin film as claimed in claim 8, wherein the thin film is transparent.

10. The thin film as claimed in claim 8 or 9, wherein the thin film is formed on a glass substrate.

11. The thin film as claimed in claim 8 or 9, wherein the thin film is formed on a resin substrate.

12. A semiconductor light-emitting element having the thin film claimed in claim 8 or 9.

13. A thin film forming method comprising supplying a gas including a nitrogen dioxide (NO$_2$) gas and an organometallic gas containing at least Zn, or a gas including a nitrogen dioxide ($NO_2$) gas, a nitrogen ($N_2$) gas, and an organometallic material gas containing at least Zn, thereby forming, on a film forming object, at least a nitrogen (N)-doped ZnO-based compound thin film by thermal CVD.

\* \* \* \* \*